(12) United States Patent
Lan et al.

(10) Patent No.: US 10,862,005 B2
(45) Date of Patent: Dec. 8, 2020

(54) LIGHT EMITTING DEVICE AND MANUFACTURING METHOD THEREOF

(71) Applicant: Au Optronics Corporation, Hsinchu (TW)

(72) Inventors: Yi-Fen Lan, Taichung (TW); Chin-Yuan Ho, Hsinchu (TW); Tsung-Tien Wu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/151,349

(22) Filed: Oct. 4, 2018

(65) Prior Publication Data

US 2020/0028030 A1    Jan. 23, 2020

(30) Foreign Application Priority Data

Jul. 17, 2018  (TW) .............................. 107124684 A

(51) Int. Cl.
| | |
|---|---|
| *H01L 33/36* | (2010.01) |
| *H01L 33/08* | (2010.01) |
| *H01L 33/26* | (2010.01) |
| *H01L 21/02* | (2006.01) |

(52) U.S. Cl.
CPC ........ *H01L 33/36* (2013.01); *H01L 21/02697* (2013.01); *H01L 33/08* (2013.01); *H01L 33/26* (2013.01)

(58) Field of Classification Search
None
See application file for complete search history.

(56) References Cited

U.S. PATENT DOCUMENTS

| | | | |
|---|---|---|---|
| 7,888,688 B2 | 2/2011 | Shi | |
| 9,214,611 B2* | 12/2015 | Ooyabu | ................ H01L 33/54 |
| 9,559,279 B1* | 1/2017 | Tomizawa | .............. H01L 33/62 |
| 2002/0096994 A1* | 7/2002 | Iwafuchi | ............. H01L 21/6835 |
| | | | 313/495 |

(Continued)

FOREIGN PATENT DOCUMENTS

| | | |
|---|---|---|
| CN | 102479902 | 5/2012 |
| CN | 203859142 | 10/2014 |

(Continued)

*Primary Examiner* — Zandra V Smith
*Assistant Examiner* — Lawrence C Tynes, Jr.
(74) *Attorney, Agent, or Firm* — JCIPRNET

(57) ABSTRACT

A light emitting device includes a substrate, an adhesion layer, a micro light emitting device (μLED), a first conductive layer, and a second conductive layer. A light emitting surface of the μLED is away from the substrate. The μLED includes a first semiconductive layer, a second semiconductive layer, a tether layer, a first electrode, and a second electrode. The tether layer covers a portion of sidewalls of the first semi-conductive layer, a portion of a bottom surface of the first semi-conductive layer, sidewalls of the second semiconductive layer, and a portion of a bottom surface of the second semiconductive layer. The first electrode and the second electrode are respectively electrically connected to the first semiconductive layer and the second semiconductive layer. The first conductive layer and the second conductive layer are respectively electrically connected to the first electrode and the second electrode.

10 Claims, 22 Drawing Sheets

(56) References Cited

U.S. PATENT DOCUMENTS

| | | | |
|---|---|---|---|
| 2006/0157722 A1* | 7/2006 | Takezawa | H01L 33/60 257/98 |
| 2007/0145401 A1* | 6/2007 | Ikehara | H01L 25/0753 257/98 |
| 2011/0300644 A1* | 12/2011 | Akimoto | H01L 33/508 438/7 |
| 2013/0313589 A1* | 11/2013 | Tomizawa | H01L 33/48 257/98 |
| 2013/0313590 A1* | 11/2013 | Akimoto | H01L 33/502 257/98 |
| 2014/0239318 A1* | 8/2014 | Oyu | H01L 24/82 257/88 |
| 2015/0280089 A1* | 10/2015 | Obata | H01L 33/0093 257/98 |
| 2015/0340346 A1 | 11/2015 | Chu et al. | |
| 2016/0087149 A1* | 3/2016 | Miyachi | H01L 33/405 362/509 |
| 2016/0218095 A1* | 7/2016 | Sugizaki | H01C 7/105 |
| 2016/0268471 A1* | 9/2016 | Endo | H01L 33/56 |
| 2016/0351755 A1* | 12/2016 | Lee | H01L 33/56 |
| 2017/0102797 A1* | 4/2017 | Cok | G06F 3/0445 |
| 2017/0338374 A1* | 11/2017 | Zou | H01L 33/44 |
| 2018/0006186 A1 | 1/2018 | Bower et al. | |
| 2018/0277528 A1* | 9/2018 | Hasegawa | H01L 24/19 |
| 2019/0097085 A1* | 3/2019 | Tomizawa | H01L 33/38 |

FOREIGN PATENT DOCUMENTS

| | | |
|---|---|---|
| CN | 107579141 | 1/2018 |
| CN | 107968145 | 4/2018 |
| CN | 108231968 | 6/2018 |

\* cited by examiner

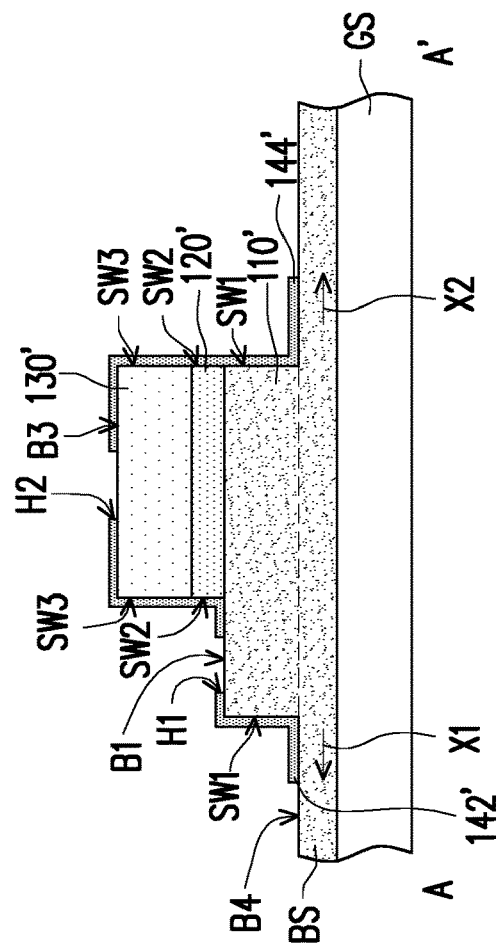
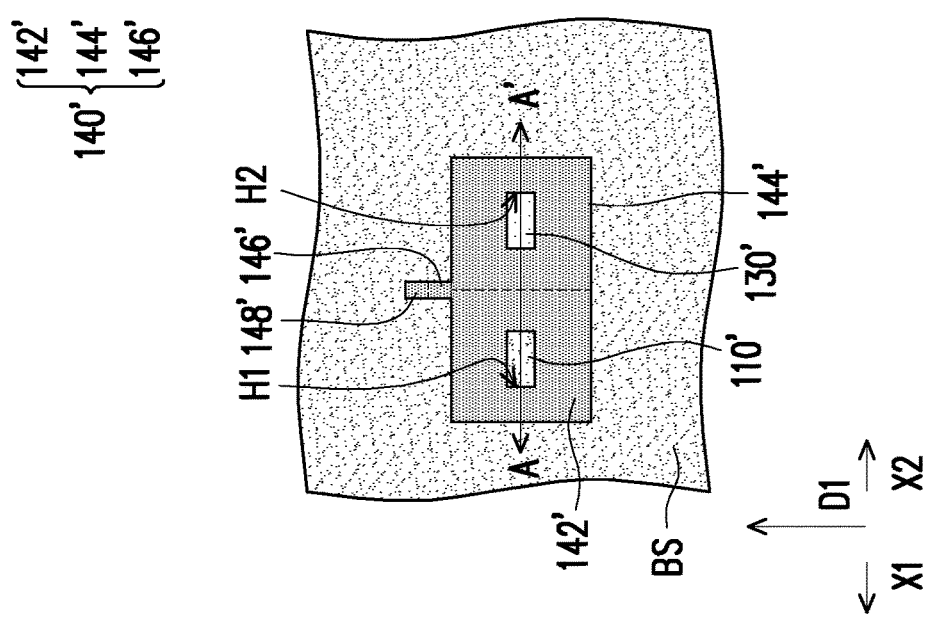
FIG. 6B
FIG. 6A

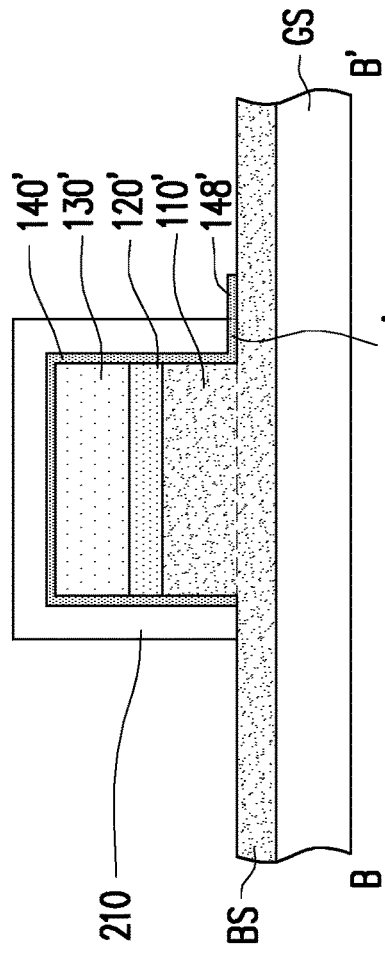
FIG. 8B
FIG. 8C
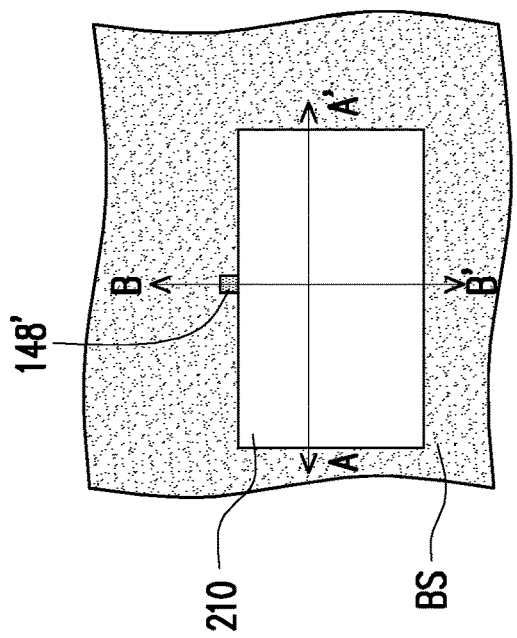
FIG. 8A

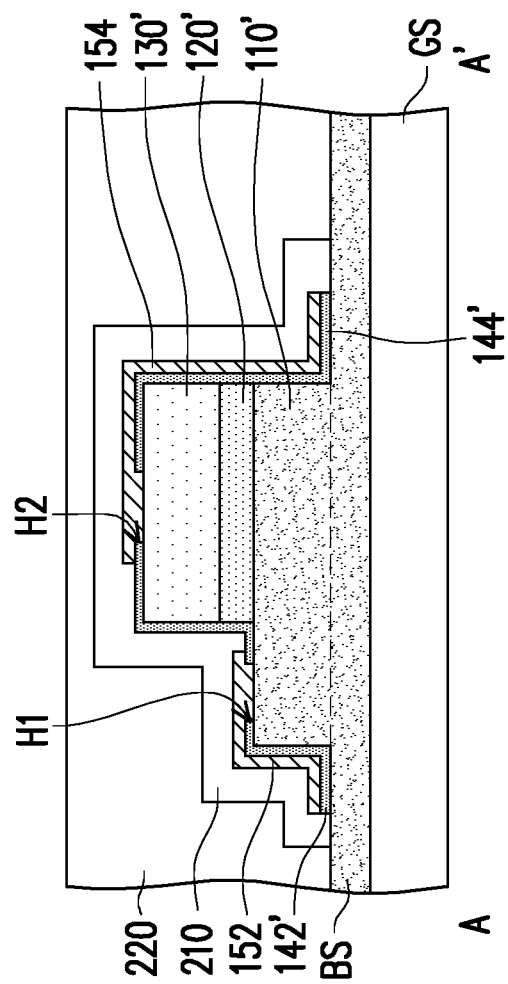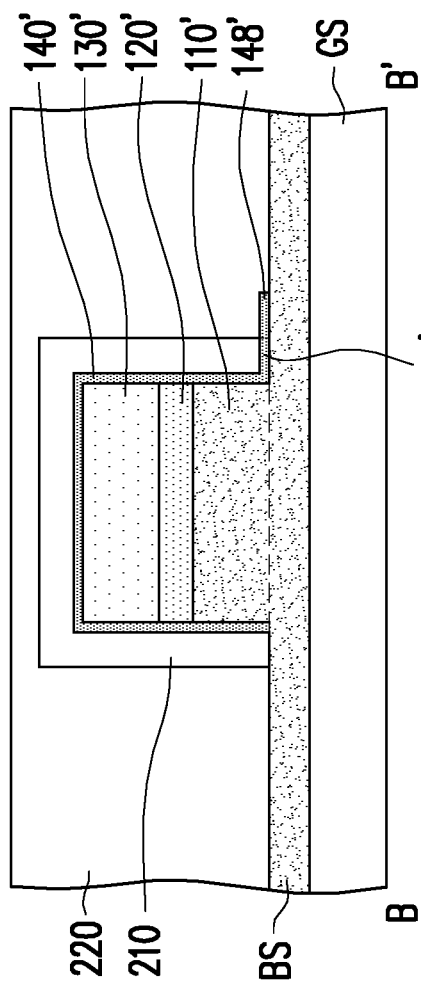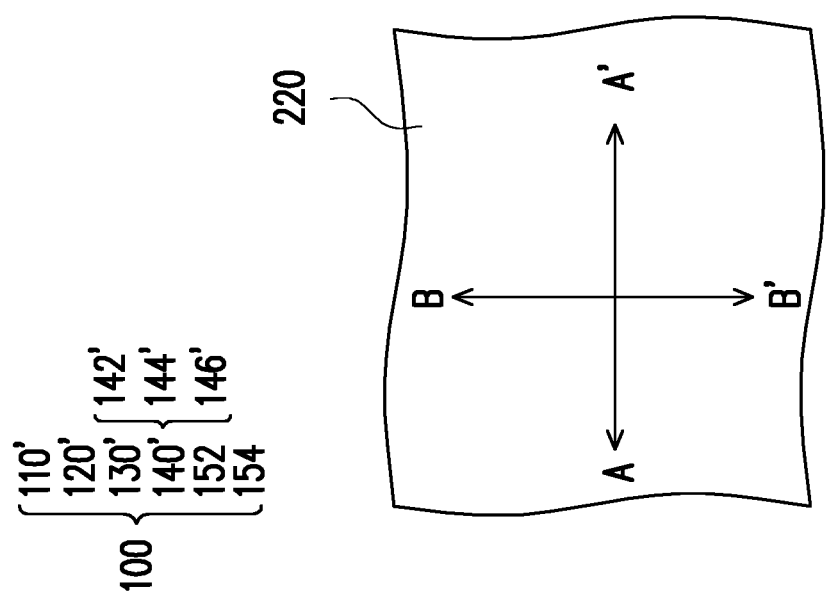
FIG. 9B
FIG. 9C
FIG. 9A

LIGHT EMITTING DEVICE AND MANUFACTURING METHOD THEREOF

CROSS-REFERENCE TO RELATED APPLICATION

This application claims the priority benefit of Taiwan application serial no. 107124684, filed on Jul. 17, 2018. The entirety of the above-mentioned patent application is hereby incorporated by reference herein and made a part of this specification.

BACKGROUND OF THE DISCLOSURE

Field of the Disclosure

The disclosure relates to a light emitting device, and more particularly relates to a light emitting device having a tether layer and a manufacturing method thereof.

Description of Related Art

A light emitting device of micro light emitting devices (or micro light-emitting diodes) is a new generation display device, which has the advantages of high efficiency, long life, not easy to break, fast reaction time and high reliability. However, there may still be problems such as an effective light-emitting area of the micro light emitting device (μLED) being too small.

SUMMARY

An exemplary embodiment of the disclosure provides a light emitting device that can increase an effective light emitting area of the micro light emitting device.

An embodiment of the disclosure of a light emitting device includes a substrate, an adhesive layer, a micro light emitting device, a first conductive layer and a second conductive layer. The adhesive layer is disposed on the substrate. A lower surface of the adhesive layer faces the substrate and an upper surface of the adhesive layer faces away from the substrate. The micro light emitting device is located in a groove of the adhesive layer. A light emitting surface of the micro light emitting device is away from the substrate. The micro light emitting device includes a first semiconductor layer, a second semiconductor layer, a tether layer, a first electrode, and a second electrode. The second semiconductor layer overlaps the first semiconductor layer. A vertical projected area of the first semiconductor layer is larger than a vertical projected area of the second semiconductor layer. The second semiconductor layer is closer to the substrate than the first semiconductor layer. The tether layer covers a portion of the side surface of the first semiconductor layer, a portion of a lower surface of the first semiconductor layer, a side of the second semiconductor layer, and a portion of a lower surface of the second semiconductor layer. The tether layer has a first through hole and a second through hole. The first through hole corresponds to the portion of the lower surface of the first semiconductor layer and the second through hole corresponds to the portion of the lower surface of the second semiconductor layer. The first electrode is disposed on the tether layer, and electrically connected to the first semiconductor layer through the first through hole. The second electrode is disposed on the tether layer, and electrically connected to the second semiconductor layer through the second through hole. The first conductive layer is disposed on the substrate, and electrically connected to the first electrode. The second conductive layer is disposed on the substrate, and electrically connected to the second electrode.

The disclosure of a method for manufacturing a light emitting device including: forming a micro light emitting device on a growth substrate, wherein the micro light emitting device includes a first semiconductor layer, a second semiconductor layer, a tether layer, a first electrode and a second electrode, the tether layer is disposed on the first semiconductor layer and the second semiconductor layer, and the tether layer has a first extension portion, a second extension portion, and at least one tether extending along a predetermined direction, the first electrode and the second electrode are respectively disposed on the first extension portion and the second extension portion, and electrically connected to the first semiconductor layer and the second semiconductor layer respectively; forming a first sacrificial layer on the micro light emitting device; forming a second sacrificial layer on the micro light emitting device, wherein the tether is connected to a sacrificial portion, and the sacrificial portion contacts the second sacrificial layer; providing an interposer substrate on the second sacrificial layer to form an interposer structure, inverting the interposer structure, and removing the growth substrate; removing the first sacrificial layer; forming an adhesive layer on a substrate; using a transposition device to make contact with the first semiconductor layer of the micro light emitting device, and transposing the micro light emitting device to the adhesive layer; and forming a first conductive layer and a second conductive layer on the substrate, the first conductive layer and the second conductive layer are electrically connected to the first electrode and the second electrode respectively.

To make the aforementioned features and advantages of disclosure more comprehensible, several embodiments accompanied with drawings are described in detail below.

BRIEF DESCRIPTION OF THE DRAWINGS

FIGS. 2A to 12A and 15A to 17A are top view schematics of a method of manufacturing a light emitting device according to a first embodiment of the disclosure.

FIGS. 2B to 12B and 15B to 17B are cross-sectional view schematics showing a method of manufacturing a light emitting device according to the first embodiment of the disclosure.

FIGS. 7C to 12C, 13, 14, 15C, and 16C are cross-sectional view schematics showing a method of manufacturing a light emitting device according to the first embodiment of the disclosure.

DESCRIPTION OF THE EMBODIMENTS

Figure 1:
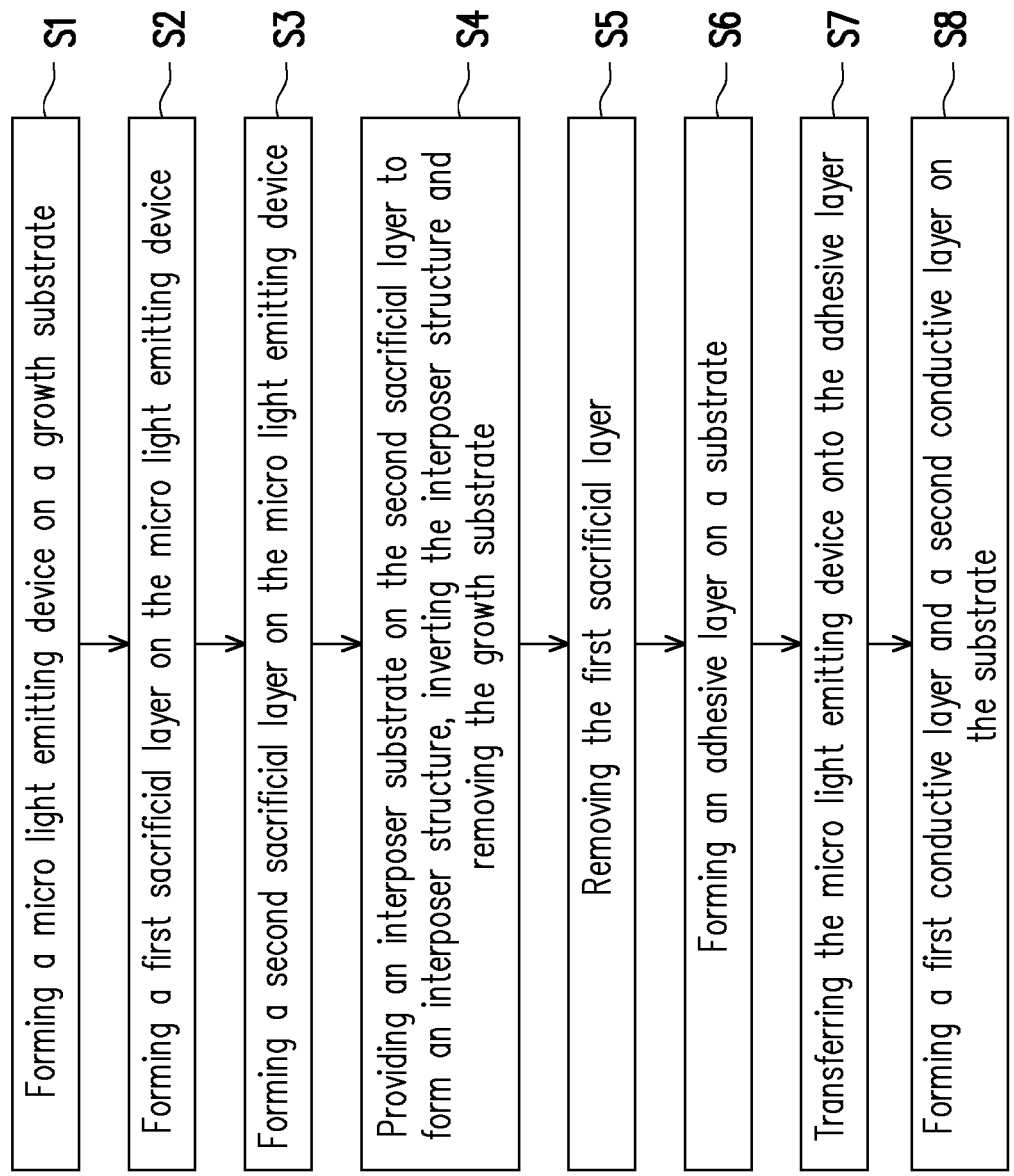
FIG. 1 is a flow chart of a method of manufacturing a light emitting device according to an embodiment of the disclosure.

The various embodiments of the disclosure will be disclosed in the schematics, for clear explanation, many practical details will be explained altogether in the following narrative. However, it should be understood that these practical details are not applied to limit the disclosure. That is, in some embodiments of the disclosure, these practical details are not necessary. In addition, for the purpose of simplifying the schematics, some of the conventional structures and elements are omitted in the schematics or presented in a simple way.

Throughout the specification, the same reference numerals indicate the same or similar elements. In the FIGS., the thickness of layers, films, panels, areas, etc. are magnified for clarity. It should be understood that when an element is referred to as being "on" or "connected" to another element, the element may be directly on or connected to the other element, or other intermediate elements may exist between the element and the other element. In contrast, when an element is referred to as "directly on another element" or "directly connected to another element", there are no other intermediate elements between the element and the other element. As used herein, "connection" may refer to physical and/or electrical connections. Furthermore, the "electrically connected" or "coupling" of two elements is not limited to the direct connection of two elements to each other, other elements may exist between the two elements.

It should be understood that although the terminology "first" and "second" and the like may be used herein to describe various elements, components, regions, layers and/or parts, however, these elements, components, regions, and/or parts should not be limited by these terms. These terms are only used to distinguish one element, component, region, layer or part.

The terminology used herein is for the purpose of describing a particular embodiment of the disclosure, rather than limiting the disclosure. For example, the use of "a", "an" and "the" does not mean that the element is singular or plural. The word "or" used in this document means "and/or". As used herein, the term "and/or" includes any and all combinations of one or more of the associated listed items. It should also be understood that when used in this specification, the terms "including" or "comprising" are used to designate the existence of the features, regions, integers, steps, operations, elements, and/or components, however, the existence or addition of one or more other features, regions, integers, steps, operations, elements, components and/or combinations thereof are not excluded.

In addition, relative terms such as "lower" or "bottom" and "upper" or "top" may be used herein to describe the relationship of one component to another component as the figure shows. It should be understood that relative terms are intended to include different orientations of the component in addition to the orientation shown in the figures. e.g., if a device in a drawing is flipped, then the components that are described to be originally on the "lower" side of other components will be oriented on the "upper" side of the other components. Therefore, the exemplary term "down" can include the orientation of "down" and "up", depending on a specific orientation of the figure. Similarly, if a device in a figure is flipped, components that are described as "under" or "below" other devices will be oriented "above" other components. Therefore, the exemplary term "under" or "below" may include the orientation of above and below.

As used herein, "about," "approximately," or "substantially" includes the values and average values within acceptable deviations of the particular values determined by those of ordinary skill in the art, taking into account a measurement and a specific number of errors (e.g. limitation of measurement system) associated with the related measurement or a deviation of a manufacture system (e.g. limitation of manufacture system). For example, "about" can mean within one or more standard deviations of a value, or within ±30%, ±20%, ±10%, ±5%. Furthermore, the "about" or "substantially" used herein may choose a more acceptable range of deviations or standard deviations depending on optical properties, etching properties, or other properties, and may not use one standard deviation for all properties.

Unless otherwise defined, all terms (including technical and scientific terms) used herein have the same meaning as commonly understood by one of ordinary skill in the art to which this disclosure belongs. It will be further understood that the terms such as those defined in commonly used dictionaries should be interpreted as having meanings consistent with their meanings in the context of the related art and the disclosure, and will not be interpreted as idealized or overly formal meaning, unless explicitly defined in this specification.

FIG. 1 is a flow chart of a method of manufacturing a light emitting device in accordance with an embodiment of the disclosure. FIGS. 2A to 12A and 15A to 17A are top view schematics of a method of manufacturing a light emitting device according to the first embodiment of the disclosure. FIGS. 2B to 12B and 15B to 17B are cross-sectional view schematics showing the method of manufacturing a light emitting device according to the first embodiment of the disclosure. FIGS. 7C to 12C, 13, 14, and 15C to 16C are cross-sectional view schematics showing the method of manufacturing a light emitting device according to the first embodiment of the disclosure.

Referring to FIG. 1, the method of manufacturing the light emitting device includes steps S1 to S8. Step S1 includes forming a micro light emitting device (μLED) on a growth substrate. Step S2 includes forming a first sacrificial layer on the μLED. Step S3 includes forming a second sacrificial layer on the μLED. Step S4 includes providing an interposer substrate on the second sacrificial layer to form an interposer structure, inverting (or flipping) the interposer structure, and removing the growth substrate. Step S5 includes removing the first sacrificial layer. Step S6 includes forming an adhesive layer on a substrate. Step S7 includes transferring the μLED onto the adhesive layer. Step S8 includes forming a first conductive layer and a second conductive layer on the substrate.

Figure 7B:
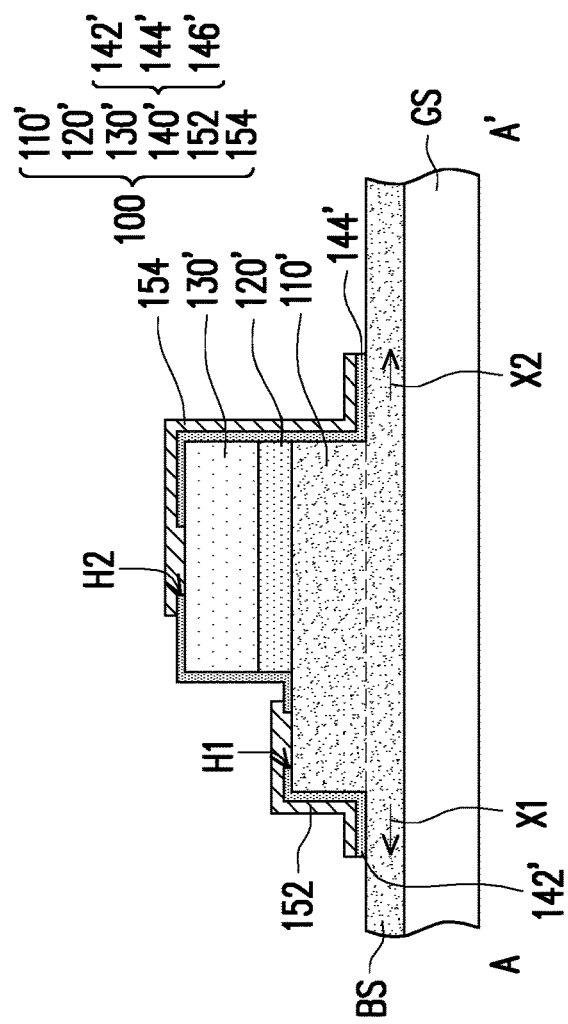
Figure 7C:
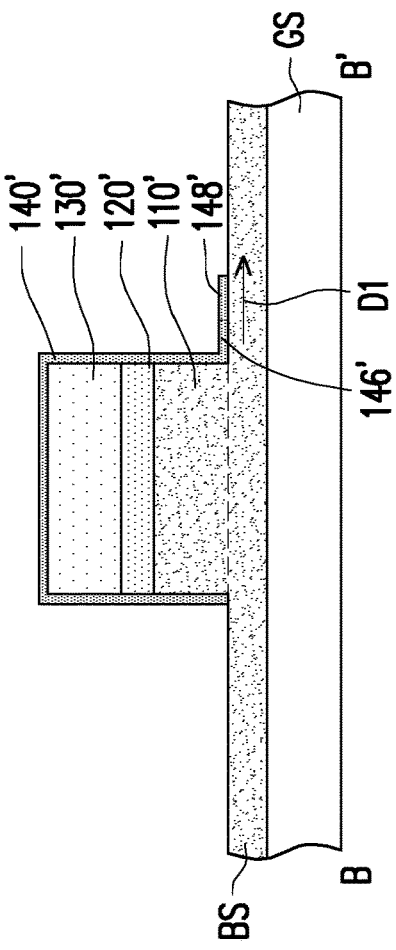
Figure 7A:
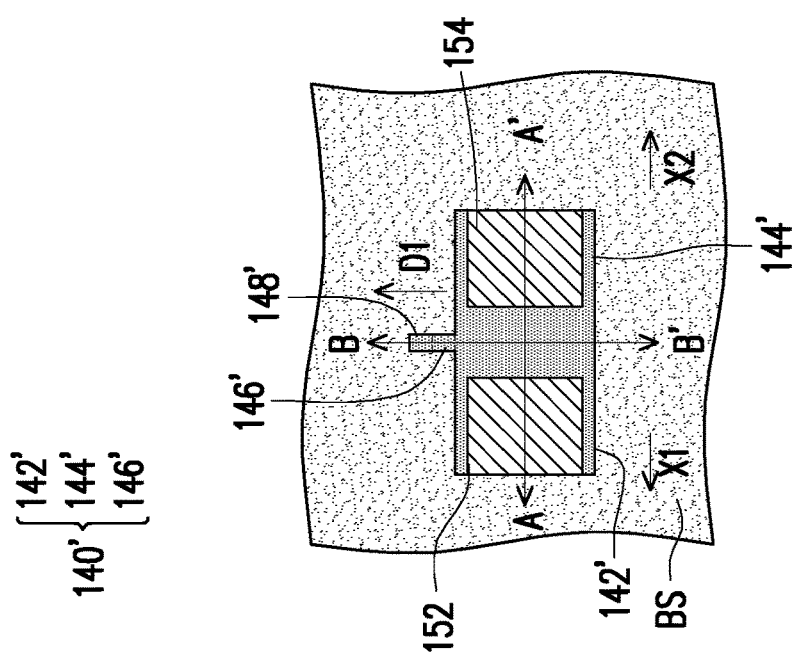

FIGS. 2A to 7A, 2B to 7B, and 7C are schematic views showing a method of forming a μLED on a growth substrate in the first embodiment of the disclosure, wherein FIGS. 2B to 7B are schematic cross-sectional views taken along line AA' of FIGS. 2A to 7A, and FIG. 7C is a schematic cross-sectional view taken along line BB' of FIG. 7A.

Figure 2B:
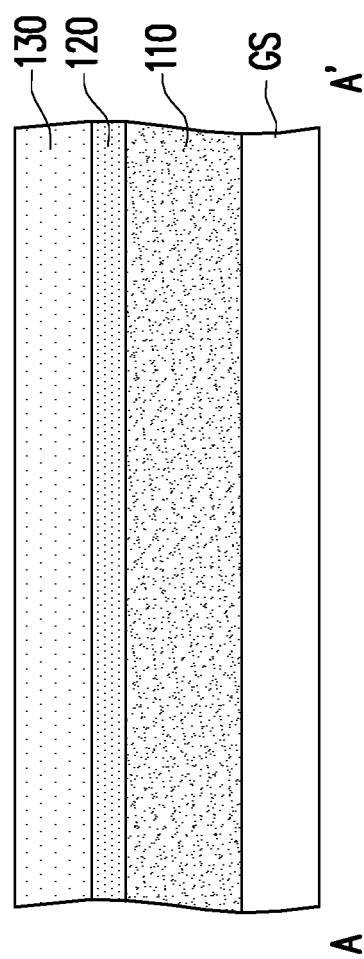
Figure 2A:
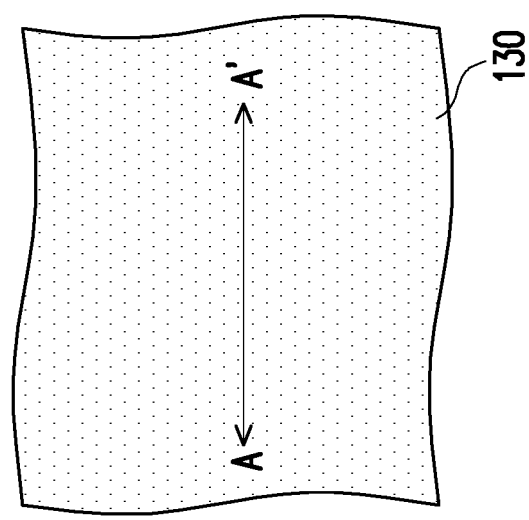

Referring to FIG. 2A and FIG. 2B, a first semiconductor material layer 110, a light emitting material layer 120, and a second semiconductor material layer 130 are formed sequentially on the growth substrate GS as an example, but not limited to this. In other embodiments, the second semiconductor material layer 130, the light emitting material layer 120, and the first semiconductor material layer 110 are sequentially formed on the growth substrate GS. In other words, the first semiconductor material layer 110, the light emitting material layer 120, and the second semiconductor material layer 130 are formed on the growth substrate GS. The growth substrate GS may be a gallium arsenide (GaAs) substrate, a gallium phosphide (GaP) substrate, an indium phosphide (InP) substrate, a sapphire substrate, a silicon carbide (SiC) substrate, a gallium nitride (GaN) substrate, or other suitable substrates. In other words, the growth substrate GS can currently be used as a temporary carrier substrate (or namely a first temporary substrate). One of the first semiconductor material layer 110 and the second semiconductor material layer 130 is an N-doped semiconductor, the other is a P-doped semiconductor. The light emitting material layer 120 is, for example, a single quantum well (SQW) or a multiple quantum well (MQW). In some embodiments, the material of the light emitting material layer 120 includes, for example, gallium nitride (GaN), indium gallium nitride (InGaN), gallium arsenide (GaAs), aluminum gallium indium phosphide (AlGaInP), indium aluminum gallium arsenide (InAlGaAs), or materials formed by other IIIA and VA group elements, or other suitable materials.

Figure 3B:
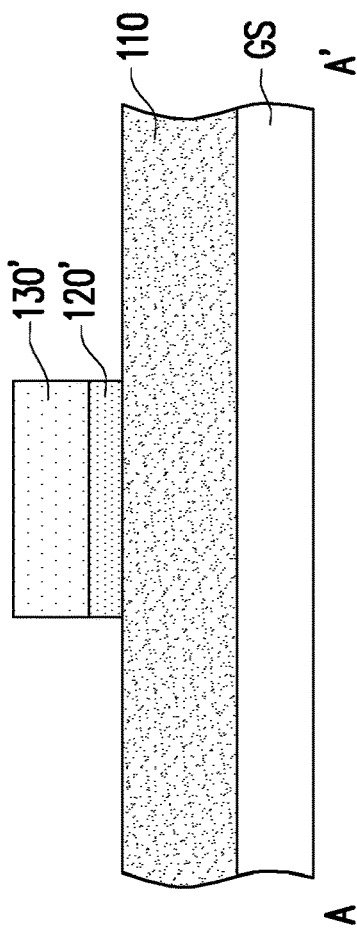
Figure 3A:
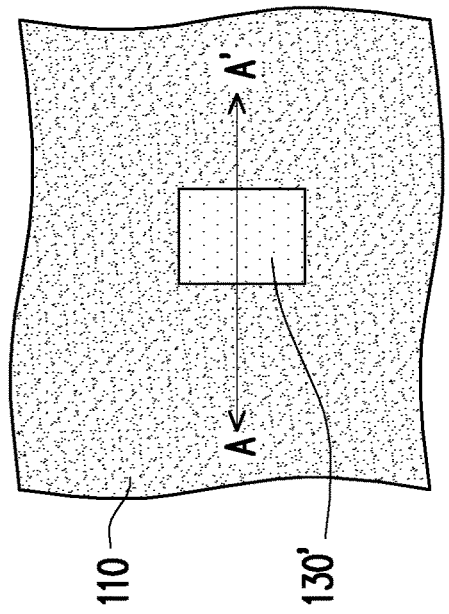

Referring to FIG. 3A and FIG. 3B, the second semiconductor material layer 130 and the light emitting material layer 120 are patterned to form a second semiconductor layer 130' and a light emitting layer 120'. A method of patterning the second semiconductor material layer 130 and the light emitting material layer 120 includes, for example, a photolithography and etching process, but not limited to this.

Figure 4B:
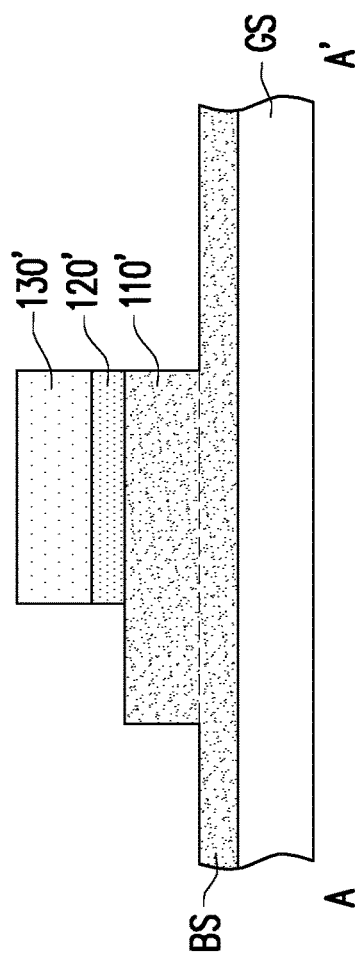
Figure 4A:
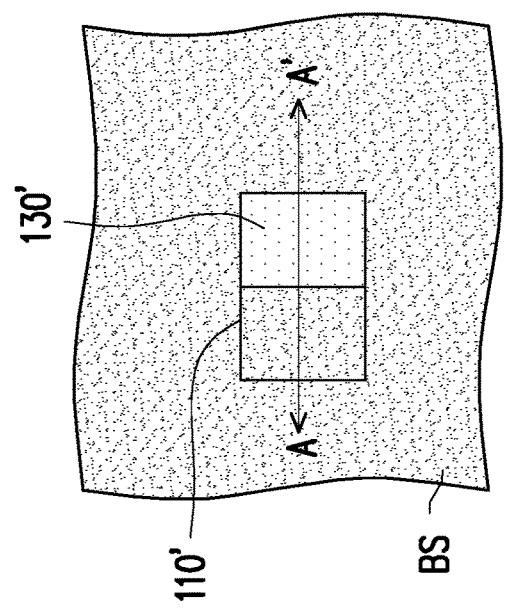

Referring to FIG. 4A and FIG. 4B, the first semiconductor material layer 110 is patterned to form a first semiconductor layer 110'. The second semiconductor layer 130' partially overlaps the first semiconductor layer 110', wherein the vertical projected area of the first semiconductor layer 110' is greater than the vertical projected area of the second semiconductor layer 130'.

In this embodiment, after patterning the first semiconductor material layer 110, a bottom layer BS is selectively existed on the growth substrate GS, and the bottom layer BS substantially covers the growth substrate GS. In some embodiments, a plurality of first semiconductor layers 110', a plurality of second semiconductor layers 130' and a plurality of light emitting layers 120' are formed on the growth substrate GS. The bottom layer BS connects the plurality of first semiconductor layers 110'.

Figure 5B:
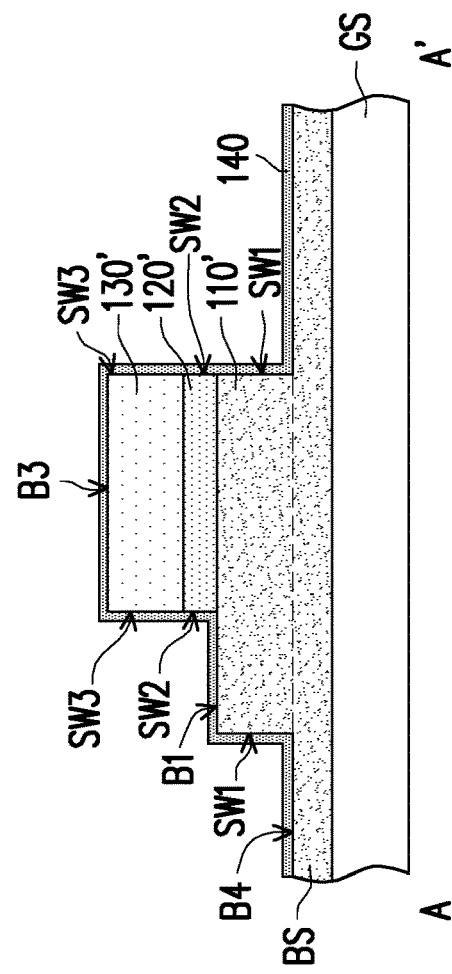
Figure 5A:
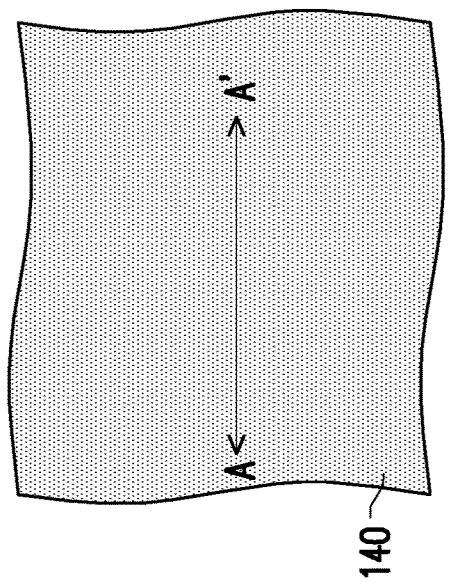

Referring to FIG. 5A and FIG. 5B, a tether material layer 140 is formed. The tether material layer 140 covers a side surface SW1 of the first semiconductor layer 110', a portion of a first surface B1 of the first semiconductor layer 110', a side surface SW3 of the second semiconductor layer 130', a first surface B3 of the second semiconductor layer 130', a side surface SW2 of the light emitting layer 120' and a portion of a first surface B4 of the bottom layer BS. The tether material layer 140 can be a single layer or a multilayer structure, and the material thereof is, for example, silicon oxide, silicon nitride, amorphous silicon, or other suitable and patternable materials.

Referring to FIG. 6A and FIG. 6B, the tether layer 140 is patterned to form the tether layer 140'. The tether layer 140' has a first extension portion 142', a second extension portion 144', and at least one tether 146' that may extend substantially along a predetermined direction D1.

The first extension portion 142' covers a portion of the first surface B1 of the first semiconductor layer 110', a portion of the side surface SW1 of the first semiconductor layer 110', and a portion of the first surface B4 of the bottom layer BS, and at least a portion of the first extension portion 142' extends from the side surface SW1 of the first semiconductor layer 110' along a direction X1 away from the first semiconductor layer 110'. In some embodiments, a portion of the first extension portion 142' covers a portion of the first surface B4 of the bottom layer BS, and a portion of the first extension portion 142' may extend substantially along the first surface B4 of the bottom layer BS or a surface of the growth substrate GS.

The second extension portion 144' covers a portion of the first surface B3 of the second semiconductor layer 130', a portion of the side surface SW3 of the second semiconductor layer 130', a portion of the side surface SW2 of the light emitting layer 120', and a portion of the side surface SW1 of the first semiconductor layer 110', and a portion of the first surface B4 of the bottom layer BS. At least a portion of the second extension portion 144' extends from the side surface SW3 of the second semiconductor layer 130' along the direction X2 away from the second semiconductor layer 110'. In some embodiments, a portion of the second extension portion 144' covers a portion of the first surface B4 of the bottom layer BS, and a portion of the second extension portion 144' may extend substantially along the first surface B4 of the bottom layer BS or the surface of the growth substrate GS.

The tether 146' connects at least one of the first extension 142' and the second extension portion 144', and the tether 146' extends from the side surface SW1 of the first semiconductor layer 110' (for example: in FIG. 6A, one of the plurality of side surfaces SW1 of the first semiconductor layer 110', but not limited to) along the direction D1 away from the first semiconductor layer 110'. One end of the tether 146' is connected to a sacrificial portion 148'. The tether 146' and the sacrificial portion 148' are, for example, integrally formed. In some embodiments, the sacrificial portion 148' and a portion of the tether 146' cover a portion of the first surface B4 of the bottom layer BS. The sacrificial portion 148' and the portion of the tether 146' may extend substantially along the first surface B4 of the bottom layer BS or the surface of the growth substrate GS. The number of tether 146' can be adjusted according to actual requirements. In other embodiments, the tether layer 140' includes two or more tethers 146'.

A first through hole H1 and a second through hole H2 may be formed in the tether layer 140'. The first through hole H1 and the second through hole H2 respectively correspond to a portion of the surface of the first semiconductor layer 110' (for example, a portion of the first surface B1) and a portion of the surface of the second semiconductor layer 120' (for example, a portion of the first surface B3). In some embodiments, the first through hole H1 and the second through hole H2 are formed in the tether layer 140' while the tether material layer 140 is patterned to form the tether layer 140'. In other words, the tether material layer 140 can be patterned into a tether layer 140' having the first through hole H1 and the second through hole H2 by one patterning process, however, the disclosure is not limited thereto.

Referring to FIG. 7A, FIG. 7B and FIG. 7C, a first electrode 152 and a second electrode 154 are formed. The first electrode 152 and the second electrode 154 are respectively disposed on the first extension portion 142' and the second extension portion 144' of the tether layer 140'. The first electrode 152 is electrically connected to the first semiconductor layer 110' through the first through hole H1. The second electrode 154 is electrically connected to the second semiconductor layer 130' through the second through hole H2.

In this embodiment, a portion of the first electrode 152 extends along the direction X1 away from the first semiconductor layer 110', and the portion of the first electrode 152 may extend substantially along the first surface B4 of the bottom layer BS or the surface of the growth substrate GS. For example, a portion of the first electrode 152 may extend from the tether layer 140' substantially along the direction X1 away from the first semiconductor layer 110'. In this embodiment, a portion of the sides of the first electrode 152 are substantially aligned with a portion of the sides of the first extension 142', however, the disclosure is not limited thereto.

In this embodiment, a portion of the second electrode 154 extends along a direction X2 away from the first semiconductor layer 110', and the portion of the second electrode 154 may extend substantially along the first surface B4 of the bottom layer BS or the surface of the growth substrate GS. For example, a portion of the second electrode 154 may extend from the tether layer 140' substantially along the direction X2 away from the first semiconductor layer 110'. In this embodiment, a portion of the sides of the second electrode 154 are substantially aligned with a portion of the sides of the second extension 144', however, the disclosure is not limited thereto.

In some embodiments, a method of forming the first electrode 152 and the second electrode 154 includes first forming a conductive material layer (not shown), then, the conductive material layer is patterned by a lithography and etching process to form the first electrode 152 and the second electrode 154, but not limited to this. In some embodiments, the method of forming the first electrode 152 and the second electrode 154 includes sputtering, coating, printing, or other applicable processes.

So far, the μLED 100 is substantially completed. The μLED 100 includes the first semiconductor layer 110', the second semiconductor layer 130', the tether layer 140', the first electrode 152 and the second electrode 154, the tether layer 140' is disposed on the first semiconductor layer 110' and the second semiconductor layer 130', and the tether layer 140' has the first extension 142', the second extension 144', and at least one tether 146' that may extend substantially along the predetermined direction D1. The first electrode 152 and the second electrode 154 are respectively disposed on the first extension portion 142' and the second extension portion 144', and electrically connected to the first semiconductor layer 110' and the second semiconductor layer 130', respectively. In the embodiment, the μLED 100 can selectively include a light emitting layer 120' disposed between the first semiconductor layer 110' and the second semiconductor layer 130'.

Although in the embodiment, the method of forming the μLED 100 on the growth substrate GS is as shown in FIGS. 2A to 7A, 2B to 7B, and 7C, however, the disclosure is not limited thereto, the μLED 100 can also be formed by other methods.

FIGS. 8A, 8B, and 8C are schematic views showing formation of the first sacrificial layer on the μLED in the first embodiment of the disclosure, wherein FIG. 8C is a schematic cross-sectional view taken along line AA' of FIG. 8A, FIG. 8B is a schematic cross-sectional view taken along line BB' of FIG. 8A.

Referring to FIG. 8A, FIG. 8B and FIG. 8C, the first sacrificial layer 210 is formed on the μLED 100. For example, the first sacrificial layer 210 covers a portion of the tether layer 140', the first electrode 152, the second electrode 154, and a portion of the bottom layer BS. The first sacrificial layer 210 exposes the sacrificial portion 148'. In other words, a portion of the sacrificial portion 148' contacts the first sacrificial layer 210. The first sacrificial layer 210 may be a single layer or a multilayer structure. The material of the first sacrificial layer 210 may be an inorganic material (for example, metal, alloy, silicon nitride, silicon oxide, or other suitable material), an organic material (for example, photoresist, polyimide, or other suitable material), or other suitable materials. For example, the first sacrificial layer 210 may be formed by at least one of the following processes: deposition process, photolithography process, coating process, printing process, or other suitable process formation.

FIGS. 9A, 9B, and 9C are schematic views showing formation of the second sacrificial layer on the μLED in the first embodiment of the disclosure, wherein FIG. 9B is a schematic cross-sectional view taken along line AA' of FIG. 9A, and FIG. 9C is a schematic cross-sectional view taken along line BB' of FIG. 9A.

Referring to FIG. 9A, FIG. 9B and FIG. 9C, the second sacrificial layer 220 is formed on the μLED 100. For example, the second sacrificial layer 220 covers the first sacrificial layer 210 and a portion of the bottom layer BS. Even more, the second sacrificial layer 220 covers the portion of the sacrificial portion 148' exposed by the first sacrificial layer 210. In other words, the portion of the sacrificial portion 148' contacts the second sacrificial layer 220. The second sacrificial layer 220 may be a single layer or a multilayer structure, and the material may be inorganic materials (for example: metal, alloy, silicon nitride, silicon oxide, or other suitable materials), or organic materials (for example: photoresist, polyimide, or other suitable materials), or other suitable materials. For example, the second sacrificial layer 220 may be formed by at least one of the following processes: deposition process, photolithography process, coating process, printing process, and other suitable process. The material of the second sacrificial layer 220 may be different from the material of the first sacrificial layer 210.

Figure 10B:
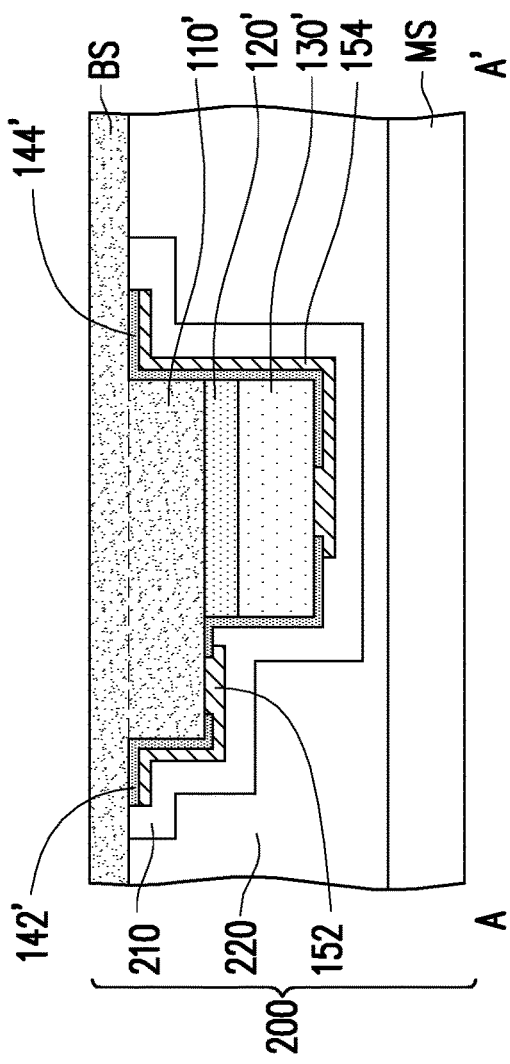
Figure 10C:
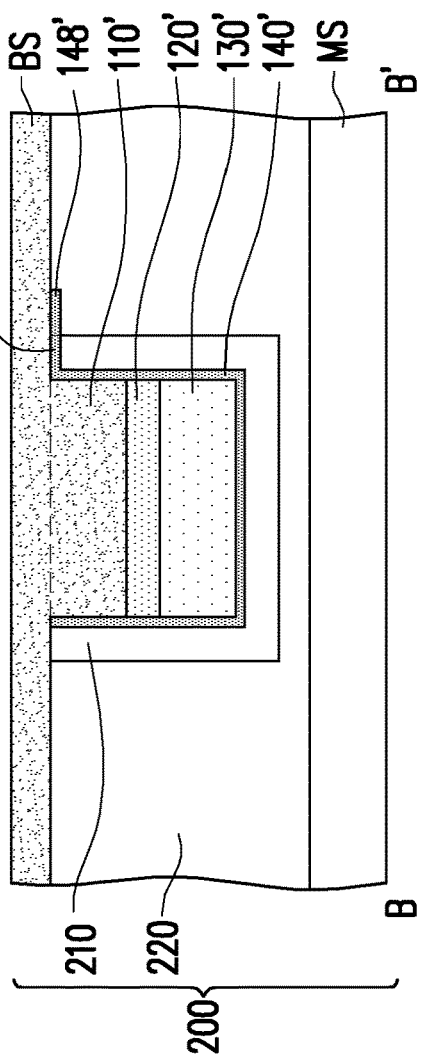
Figure 10A:
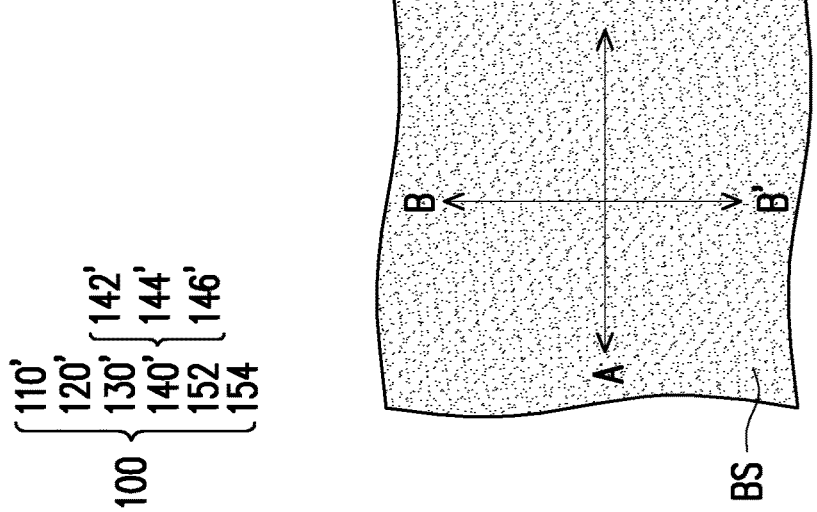

FIGS. 10A, 10B, and 10C are schematic diagrams showing that providing the interposer substrate on the second sacrificial layer to form an interposer structure in the first embodiment of the disclosure, FIG. 10B is a schematic cross-sectional view taken along line AA' of FIG. 10A, and FIG. 10C is a schematic cross-sectional view taken along line BB' of FIG. 10A.

Referring to FIGS. 10A, 10B and 10C, the interposer substrate MS is provided on the second sacrificial layer 220 to form the interposer structure 200. The interposer structure 200 includes the interposer substrate MS, the μLED 100, the bottom layer BS, the sacrificial portion 148', the first sacrificial layer 210, and the second sacrificial layer 220. The interposer structure 200 is inverted (or namely flipped), and the growth substrate GS is removed. In other words, the interposer substrate MS can be used as a temporary carrier substrate at this time (or namely a second temporary substrate). At this time, the second semiconductor layer 130' of the μLED 100 is located between the interposer substrate MS and the first semiconductor layer 110'. The second semiconductor layer 130' is closer to the interposer substrate MS than the first semiconductor layer 110', but is not limited thereto. A method of removing the growth substrate GS includes, for example, laser lift-off, or other suitable process, however, the disclosure is not limited thereto.

Figure 11B:
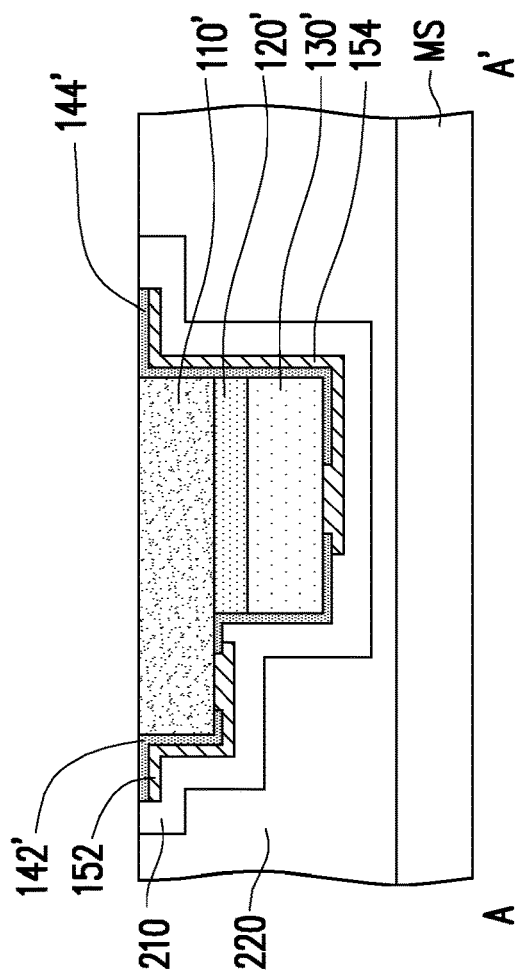
Figure 11C:
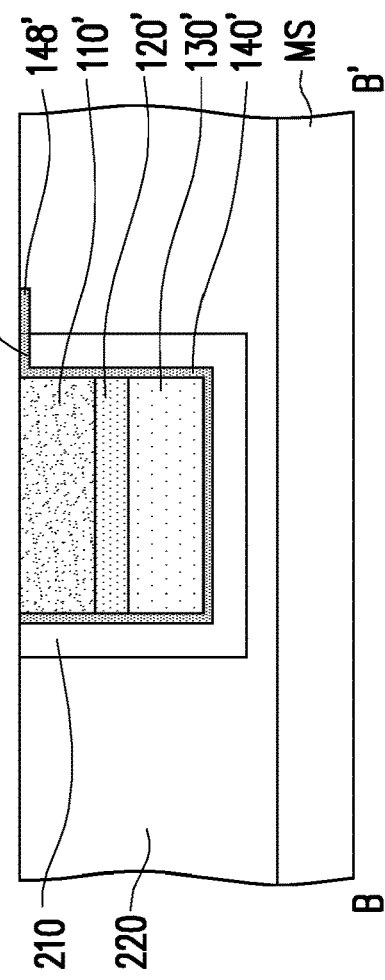
Figure 11A:
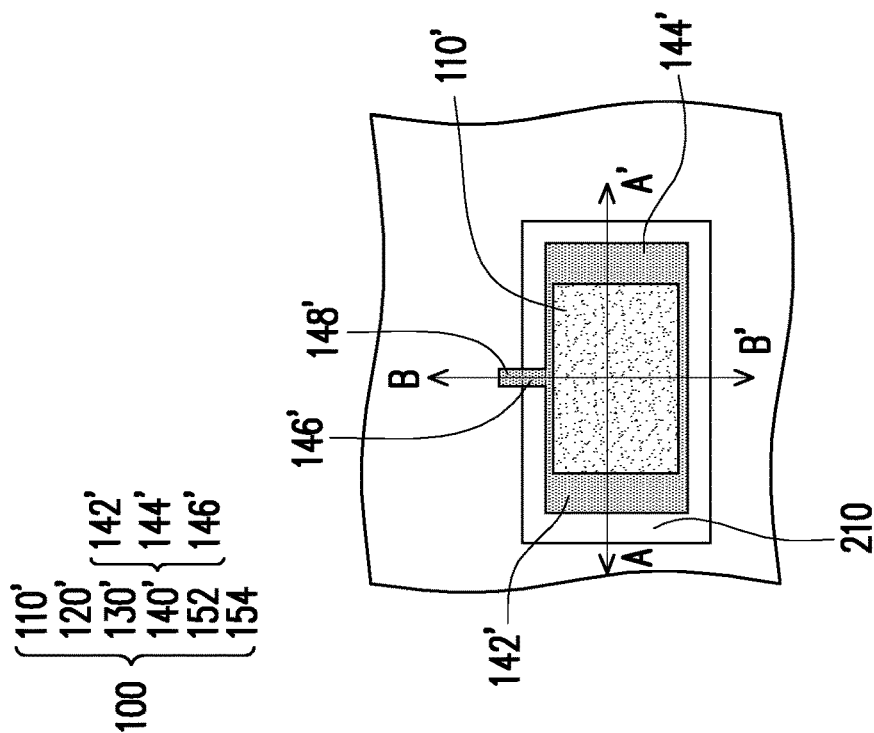

FIGS. 11A, 11B, and 11C are schematic views showing the removal of the bottom layer in the first embodiment of the disclosure, wherein FIG. 11B is a schematic cross-sectional view taken along line AA' of FIG. 11A, and FIG. 11C is a schematic cross-sectional view taken along line BB' of FIG. 11A.

Referring to FIGS. 11A, 11B and 11C, in the embodiment, after removing the growth substrate GS, the bottom layer BS is removed. At this time, the interposer structure 200 does not include the bottom layer BS. The method of removing the bottom layer BS includes, for example, grinding, or other suitable process. In other embodiments, the bottom layer BS is not formed during the process of forming the μLED 100, therefore, the step of removing the bottom layer BS may be excluded after removing the growth substrate GS.

Figure 12B:
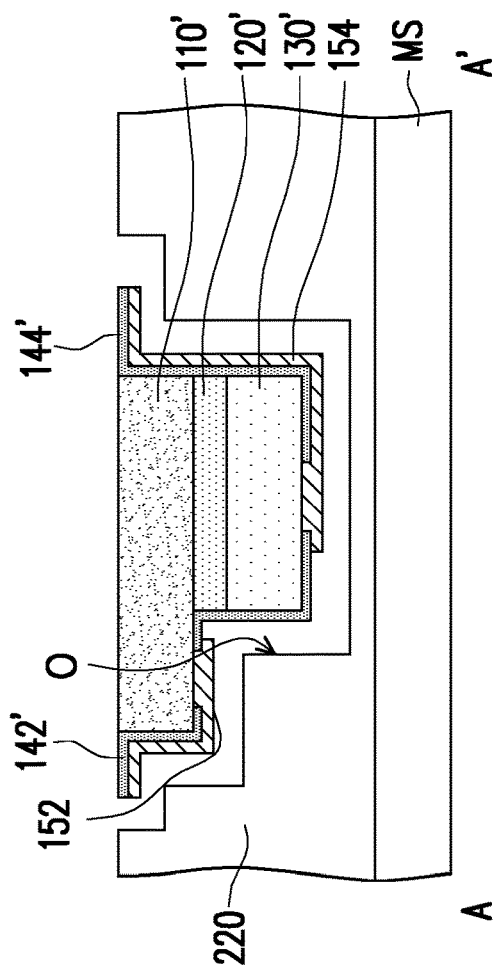
Figure 12C:
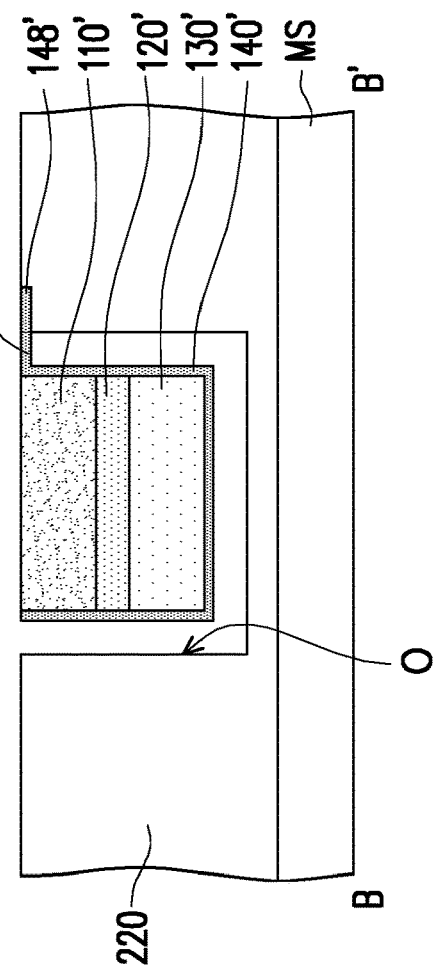
Figure 12A:
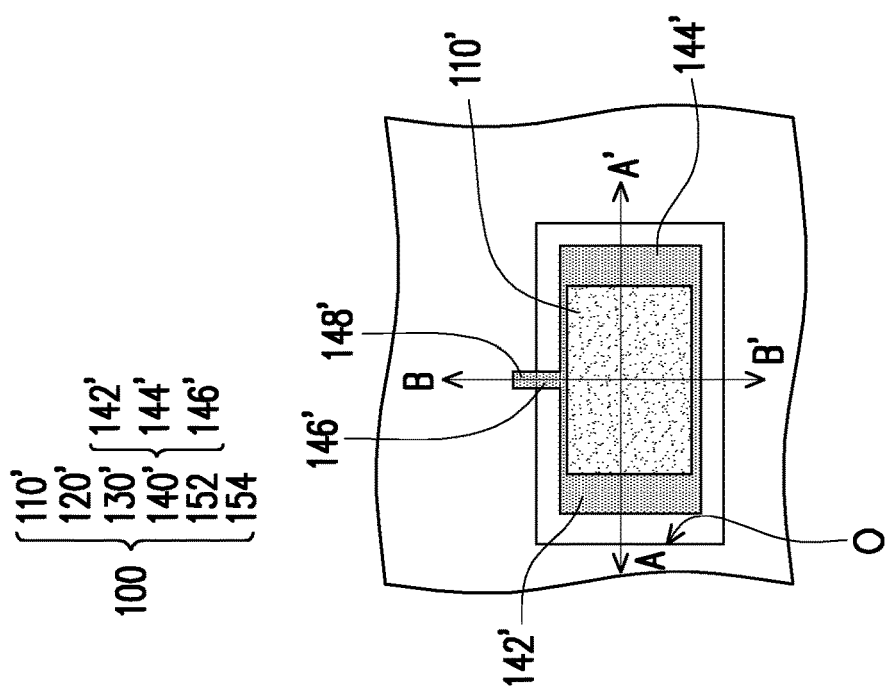

FIGS. 12A, 12B, and 12C are schematic views showing that removing the first sacrificial layer in the first embodiment of the disclosure, wherein FIG. 12B is a schematic cross-sectional view taken along line AA' of FIG. 12A, and FIG. 12C is a schematic cross-sectional view taken along line BB' of FIG. 12A.

Referring to FIGS. 12A, 12B and 12C, the first sacrificial layer 210 is removed to form an opening O. After removing the first sacrificial layer 210, the μLED 100 is supported on the second sacrificial layer 220 by the tether 146' connected with the sacrificial portion 148'. The sacrificial portion 148' and the tether 146' enable the μLED 100 to not collapse after removing the first sacrificial layer 210.

Figure 13:
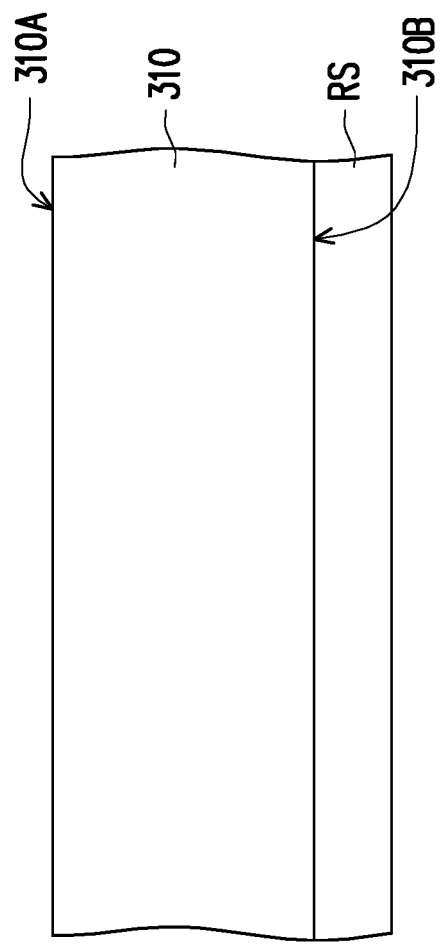

FIG. 13 is a schematic view showing that forming fan adhesive layer on a substrate in the first embodiment of the disclosure.

Referring to FIG. 13, the adhesive layer 310 is formed on the substrate RS. A lower surface 310B of the adhesive layer 310 faces the substrate RS and an upper surface 310A of the adhesive layer faces away from the substrate RS. The substrate RS includes, for example, a driving circuit (not shown in figure, and the driving circuit is, for example, including a plurality of regions, each of the regions includes at least two transistors, but not limited to this), however, the disclosure is not limited thereto. In some embodiments, there is no driving circuit in the substrate RS, the substrate RS can be electrically connected to other external driving circuits (for example, an IC chip or a film carrying an IC chip) by conductive wires. At this time, the substrate RS may be referred to as a final carrier substrate or namely a carrier substrate.

Figure 14:
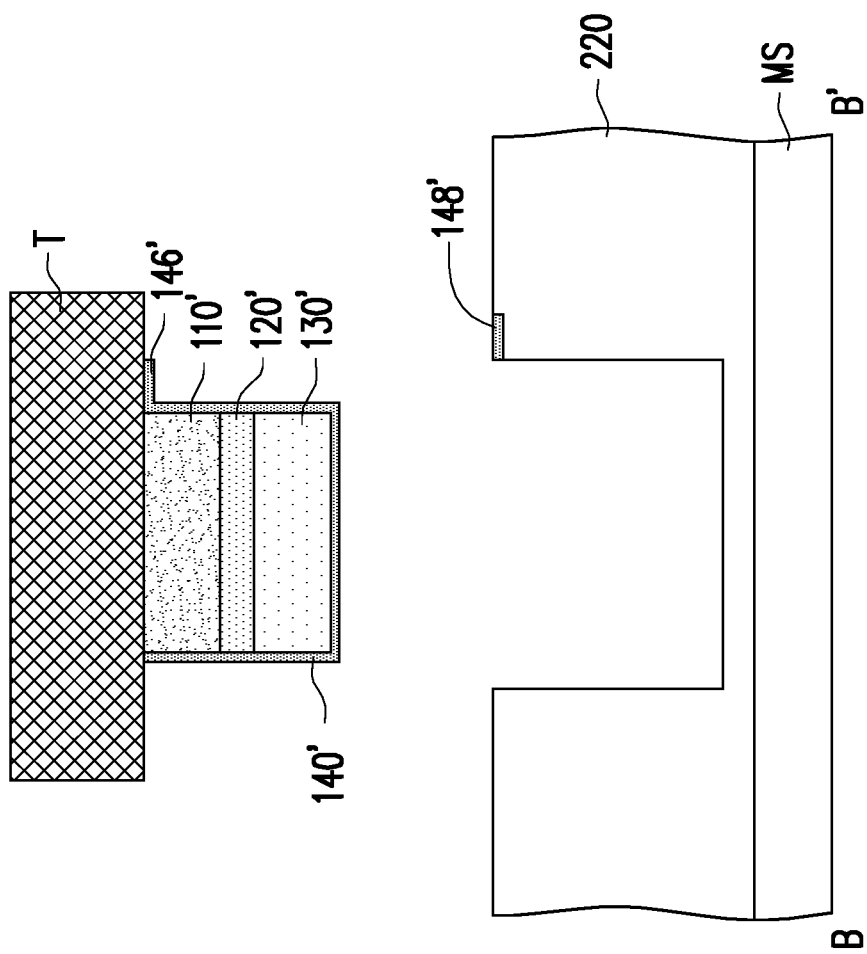
Figure 15B:
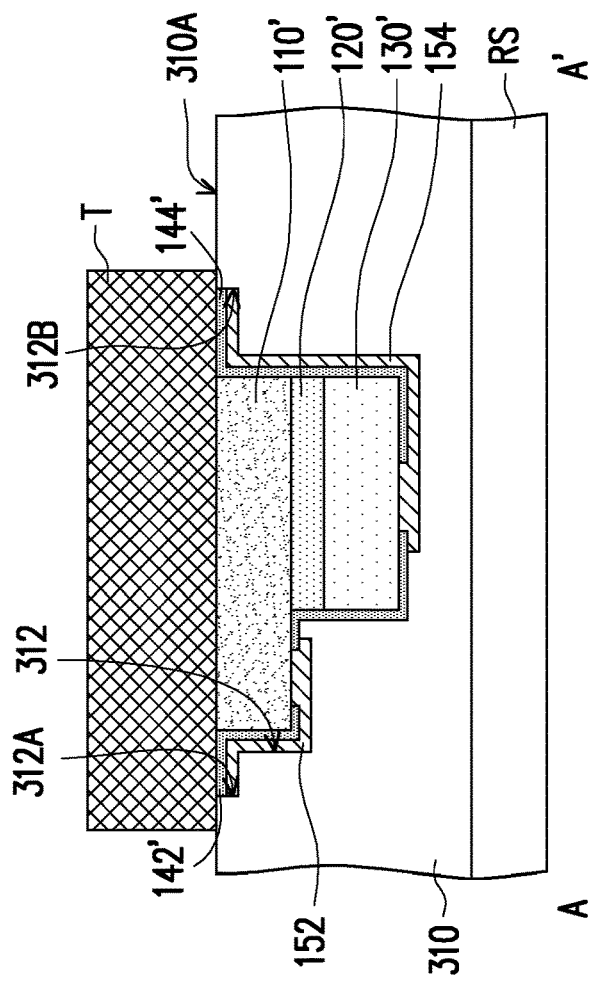
Figure 15A:
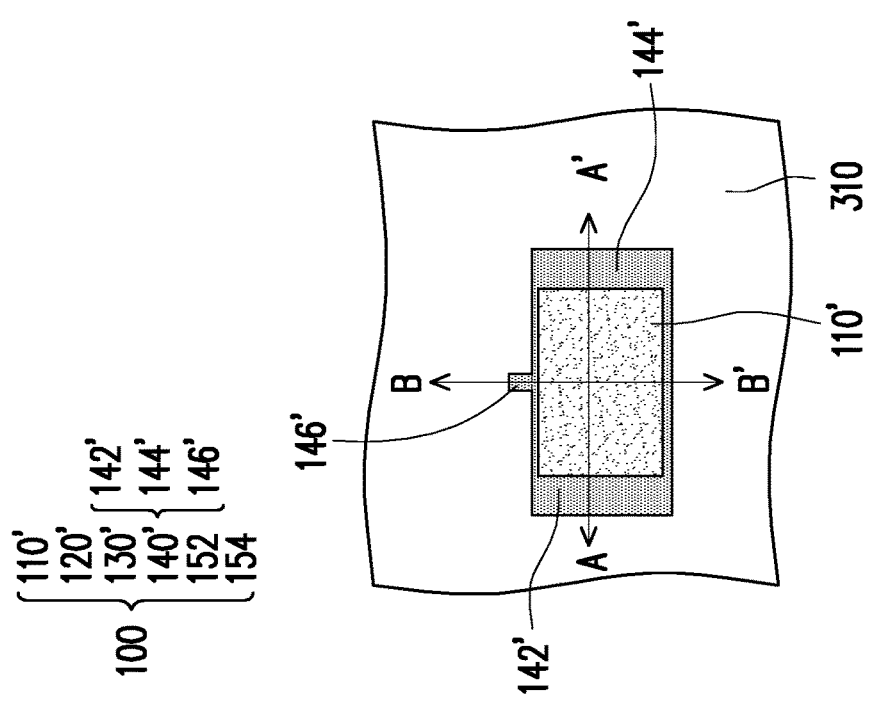
Figure 15C:
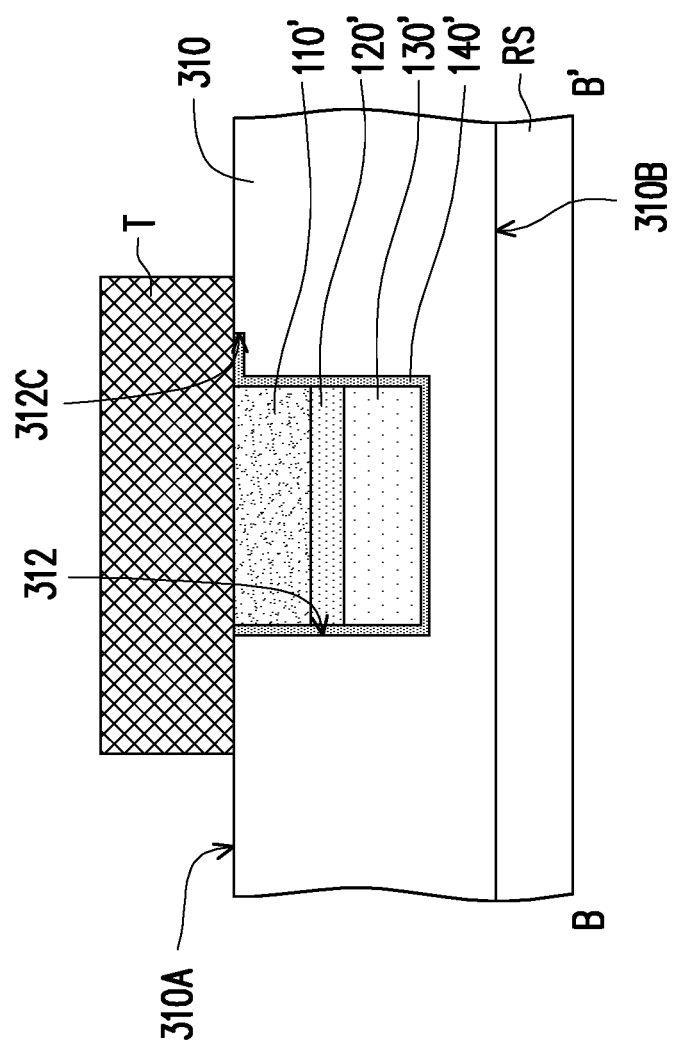

FIG. 14, FIG. 15A, FIG. 15B, and FIG. 15C are schematic views showing that transferring of the μLED onto the adhesive layer in the first embodiment of the disclosure, wherein FIG. 15B is a schematic cross-sectional view taken along line AA' of FIG. 15A, and FIG. 15C is a schematic cross-sectional view taken along line BB' of FIG. 15A.

Referring to FIG. 14, using a transferring device T to contact the first semiconductor layer 110' of the μLED 100, and lift the μLED 100. The sacrificial portion 148' is disconnected from the tether 146' of the μLED 100, and the sacrificial portion 148' and the tether 146' are separated from each other.

Referring to FIGS. 15A, 15B and 15C, the μLED 100 is transferred onto the adhesive layer 310, and the second semiconductor layer 130' is closer to the substrate RS than the first semiconductor layer 110'. In other words, the second semiconductor layer 130' of the μLED 100 is located between the substrate RS and the first semiconductor layer 110', but not limited to this. In the embodiment, an external force is applied to the transferring device T, to press the μLED 100 into the adhesive layer 310, and to form a recess 312 for accommodating the μLED 100 in the adhesive layer 310.

In the embodiment, the upper surface 310A of the adhesive layer 310 has a first sub-groove 312A, a second sub-groove 312B, and a third sub-groove 312C. The first sub-groove 312A accommodates a portion of the first extension portion 142' away from the first semiconductor layer 110' and a portion of the first electrode 152 located thereon. The second sub-groove 312B accommodates a portion of the second extension portion 144' away from the first semiconductor layer 110' and a portion of the second electrode 154 located thereon. The third sub-groove 312C accommodates the tether 146'.

Figure 16B:
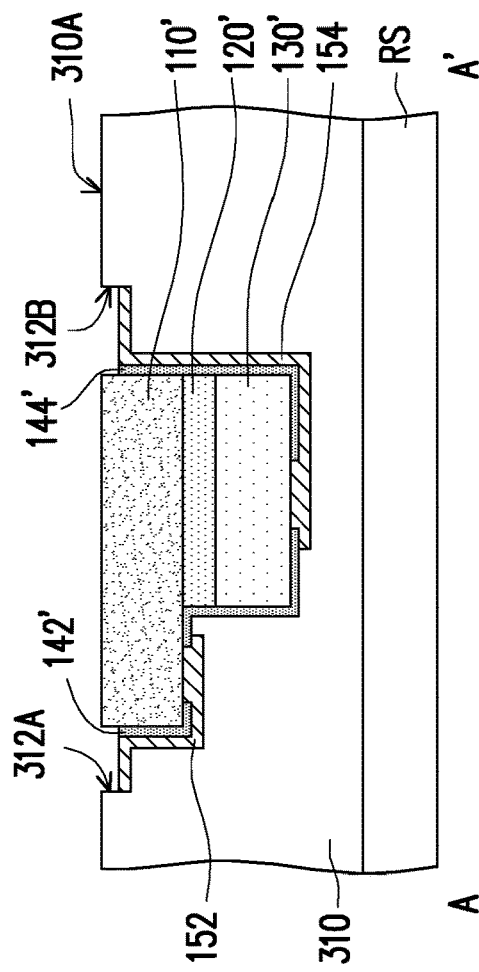
Figure 16C:
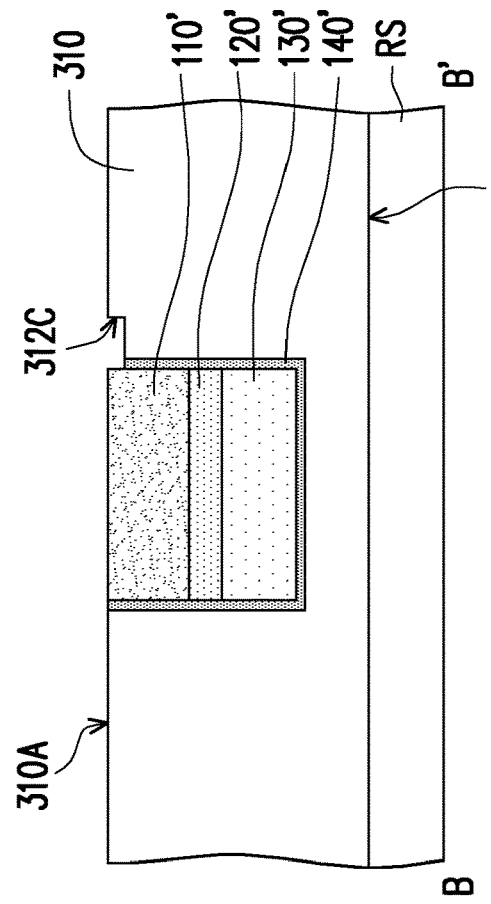
Figure 16A:
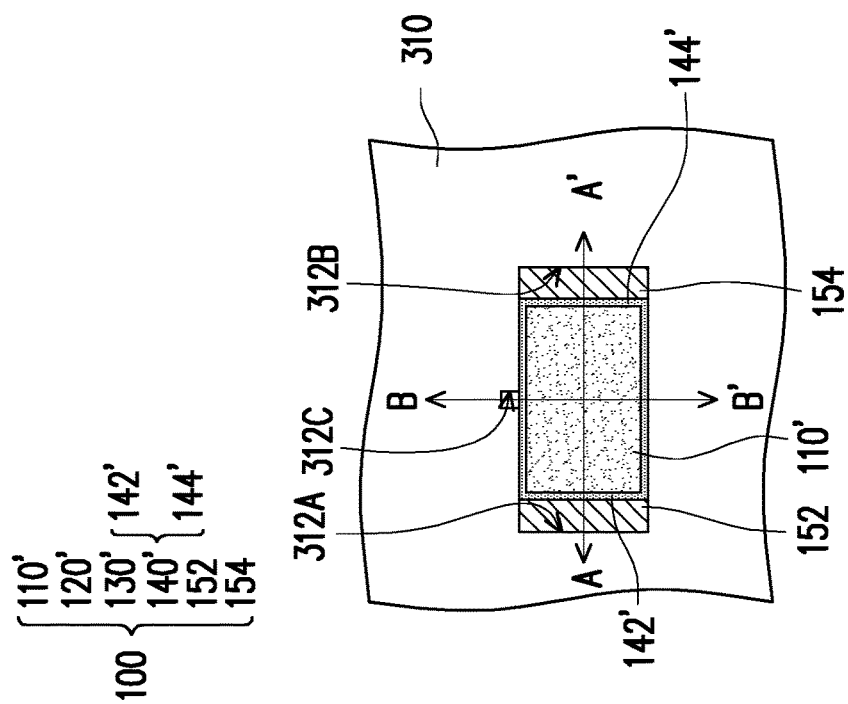

FIGS. 16A, 16B, and 16C are schematic views showing that performing an etching process to remove at least a portion of the tether layer in the first embodiment of the disclosure, wherein FIG. 16B is a schematic cross-sectional view taken along line AA' of FIG. 16A, and FIG. 16C is a schematic cross-sectional view taken along line BB' of FIG. 16A.

Referring to FIGS. 16A, 16B, and 16C, an etching process is performed to remove at least a portion of the first extension portion 142', at least a portion of the second extension portion 144', and at least a portion of the tether 146' of the tether layer 140', so that the first sub-groove 312A exposes a portion of the first electrode 152, and the second sub-groove 312B exposes a portion of the second electrode 154. Although in the embodiment, after the etching process, the height of the first extension portion 142' and the second extension portion 144' are lower than the upper surface 310A of the adhesive layer 310, and the tether 146' is completely removed, however, the disclosure is not limited thereto. In some embodiments, the height of a portion of the first extension portion 142' is still substantially equal to the height of the upper surface 310A of the adhesive layer 310 after the etching process. In other words, the first extension portion 142' may still completely cover the side of the first semiconductor layer 110' closing to the first electrode 152 after the etching process. In some embodiments, the height of a portion of the second extension 144' is still substantially equal to the height of the upper surface 310A of the adhesive layer 310 after the etching process. In other words, the second extension portion 144' may still completely cover the side of the first semiconductor layer 110' closing to the second electrode 154 after the etching process. In some embodiments, there are still some residues of the tether 146' remaining after the etching process.

Figures 17A, 17B:
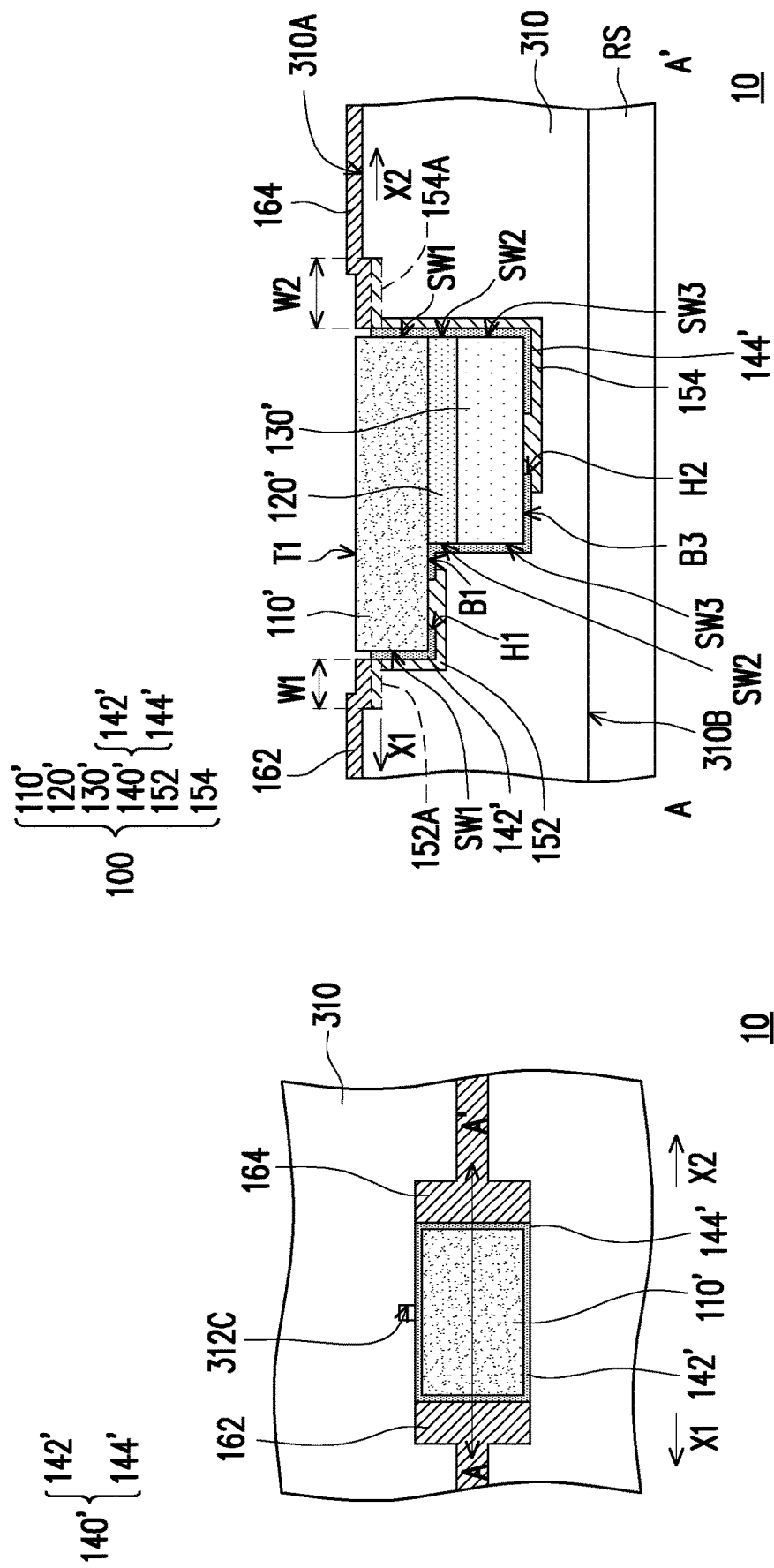

FIGS. 17A and 17B are schematic views showing that forming a first conductive layer and a second conductive layer on the substrate in the first embodiment of the disclosure, wherein FIG. 17B is a schematic cross-sectional view taken along line AA' of FIG. 17A.

Referring to FIGS. 17A and 17B, the first conductive layer 162 and the second conductive layer 164 are formed on the substrate RS. The first conductive layer 162 and the second conductive layer 164 are both located on the adhesive layer 310.

A portion of the first conductive layer 162 is filled into the first sub-groove 312A and is in contact with the first electrode 152. For example, a first overlapping portion 152A of the first electrode 152 overlaps and contacts the first conductive layer 162, but not limited to this. The first overlapping portion 152A of the first electrode 152 may extend from the tether layer 140' substantially along the first direction X1 away from the first semiconductor layer 110'. A width W1 of the first overlapping portion 152A is, for example, greater than two micrometers, but not limited to this.

A portion of the second conductive layer 164 is filled into the second sub-groove 312B and is in contact with the second electrode 154. For example, the second overlapping portion 154A of the second electrode 154 overlaps and contacts the second conductive layer 164, but not limited to this. The second overlapping portion 154A of the second electrode 154 may extend from the tether layer 140' substantially along the second direction X2 away from the first semiconductor layer 110'. A width W2 of the second overlapping portion 154A is, for example, greater than two micrometers, but not limited to this.

To this point, the light emitting device 10 is substantially completed, the light emitting device 10 includes a substrate RS, an adhesive layer 310, a μLED 100, a first conductive layer 162, and a second conductive layer 164. The adhesive layer 310 is located on the substrate RS. The lower surface 310B of the adhesive layer 310 faces the substrate RS and the upper surface 310A of the adhesive layer 310 faces away from the substrate RS. The μLED 100 is located in the recess 312 of the adhesive layer 310. The μLED 100 includes the first semiconductor layer 110', the second semiconductor layer 130', the tether layer 140', the first electrode 152, and the second electrode 154. The light emitting surface of the μLED 100 is, for example, a second surface T1 (or namely an upper surface) of the first semiconductor layer 110', and the light emitting surface of the μLED 100 is away from the substrate RS. The second semiconductor layer 130' partially overlaps the first semiconductor layer 110'. The vertical projected area of the first semiconductor layer 110' (for example, an area vertically projected on the substrate RS) is larger than the vertical projected area of the second semiconductor layer 130' (for example, the area vertically projected on the substrate RS). The second semiconductor layer 130' is closer to the substrate RS than the first semiconductor layer 110'. The tether layer 140' covers a portion of the side surface SW1 of the first semiconductor layer 110', a portion of the first surface B1 (or namely a lower surface) of the first semiconductor layer 110', a side surface SW3 of the second semiconductor layer 130', and a portion of the first side surface B3 (or namely a lower surface) of the second semiconductor layer 130'. In the embodiment, the tether layer 140' may also cover the side surface SW2 of the light emitting layer 120'. The tether layer 140' has a first through hole H1 and a second through hole H2. The first through hole H1 corresponds to a portion of the first surface B1 (or may be referred to as a lower surface) of the first semiconductor layer 110' and the second through hole H2 corresponds to a portion of the first surface B3 (or namely a lower surface) of the second semiconductor layer 130'. The first electrode 152 is located on the tether layer 140', and electrically connected to the first semiconductor layer 110' through the first through hole H1. The second electrode 154 is located on the tether layer 140', and electrically connected to the second semiconductor layer 130' through the second through hole H2. The first conductive layer 162 is located on the substrate RS, and electrically connected to the first electrode 152. The second conductive layer 164 is located on the substrate RS, and electrically connected to the second electrode 154. In the embodiment, at least a portion of the adhesive layer 310 is in addition to the adhesive effect, preferably, also has a substantially insulating effect (for example: resistance greater than $10^8$ ohms·cm, but not limited to this), the adhesive layer 310 can be a single layer or a multilayer structure, and the material thereof can be an insulating material, for example, an acrylic resin, an epoxy, a glass frit, or other suitable material, or a combination of the foregoing.

Based on the above, the first electrode 152, the second electrode 154, the first conductive layer 162, and the second conductive layer 164 of the light emitting device 10 of the embodiment do not block the light emitting surface of the μLED 100 (for example, the second surface T1), thereby the effective light emitting area of the μLED 100 can be increased.

Figure 18:
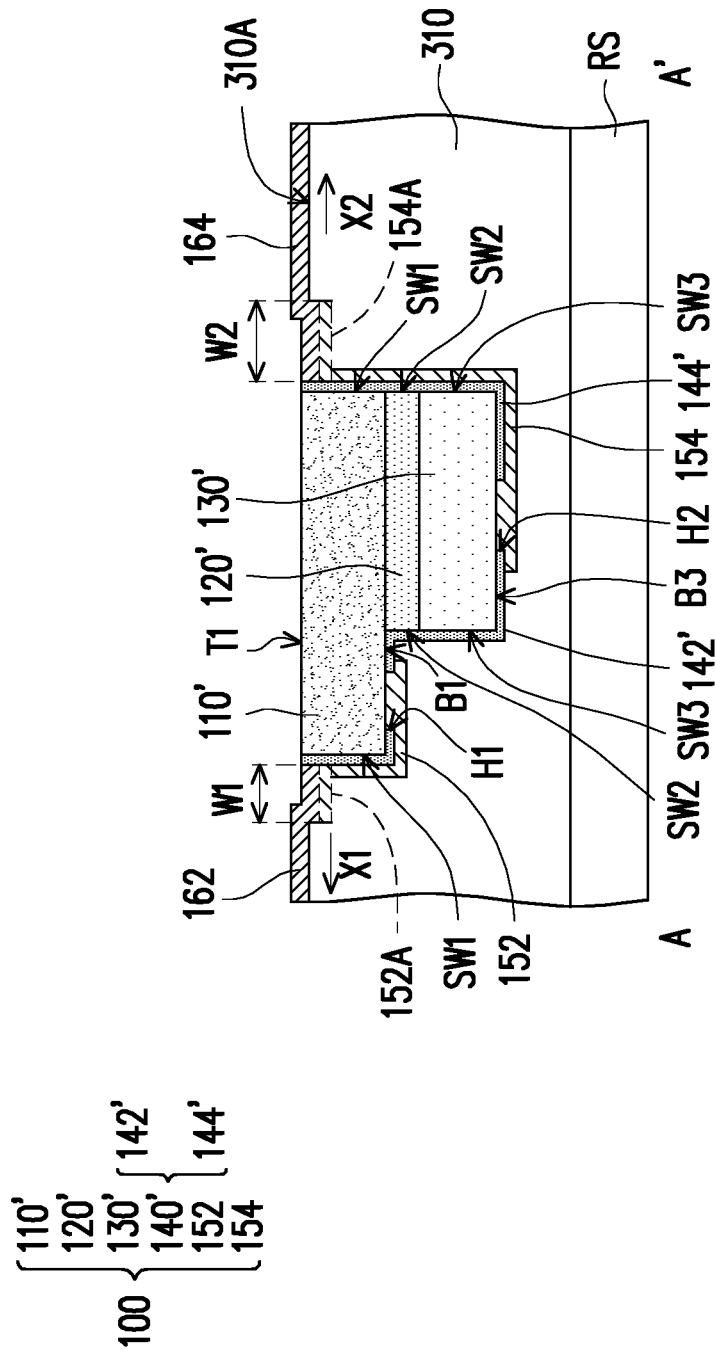
FIG. 18 is a cross-sectional view schematic showing a light emitting device according to a second embodiment of the disclosure.

FIG. 18 is a cross-sectional view showing a light emitting device in accordance with a second embodiment of the disclosure. What must be stated here is, the second embodiment follows the component number and part of the content of the first embodiment, where the same or similar reference numerals are used to denote the same or similar devices, and the description of the same technical content is omitted. For the description of the omitted part, reference may be made to the foregoing embodiment, details won't be reiterated.

Referring to FIG. 18, in the light emitting device 20 of the second embodiment, a portion of the second extension portion 144' is still substantially flush with the upper surface 310A of the adhesive layer 310 after the etching process (for example: the etching process of FIGS. 16A, 16B, and 16C). In other words, the second extension portion 144' may still completely cover the side surface of the first semiconductor layer 110' closing to the second electrode 154 after the etching process. The "substantially flush" can be means an upper surface of the portion of the second extension portion 144' is substantially aligned with the upper surface 310A of the adhesive layer 310. In other words, a height of the portion of the second extension portion 144' is substantially equal to a height of the upper surface 310A of the adhesive layer 310. The portion of the tether layer 140' is located between the second conductive layer 164 and the first semiconductor layer 110', thereby, a short circuit between the second conductive layer 164 and the first semiconductor layer 110' can be avoided.

In the embodiment, a portion of the first extension portion 142' is still substantially flush with the upper surface 310A of the adhesive layer 310. In other words, the portion of the first extension portion 142' may still completely cover the side surface of the first semiconductor layer 110' closing to the first electrode 152 after the etching process, however, the disclosure is not limited thereto.

Figure 19:
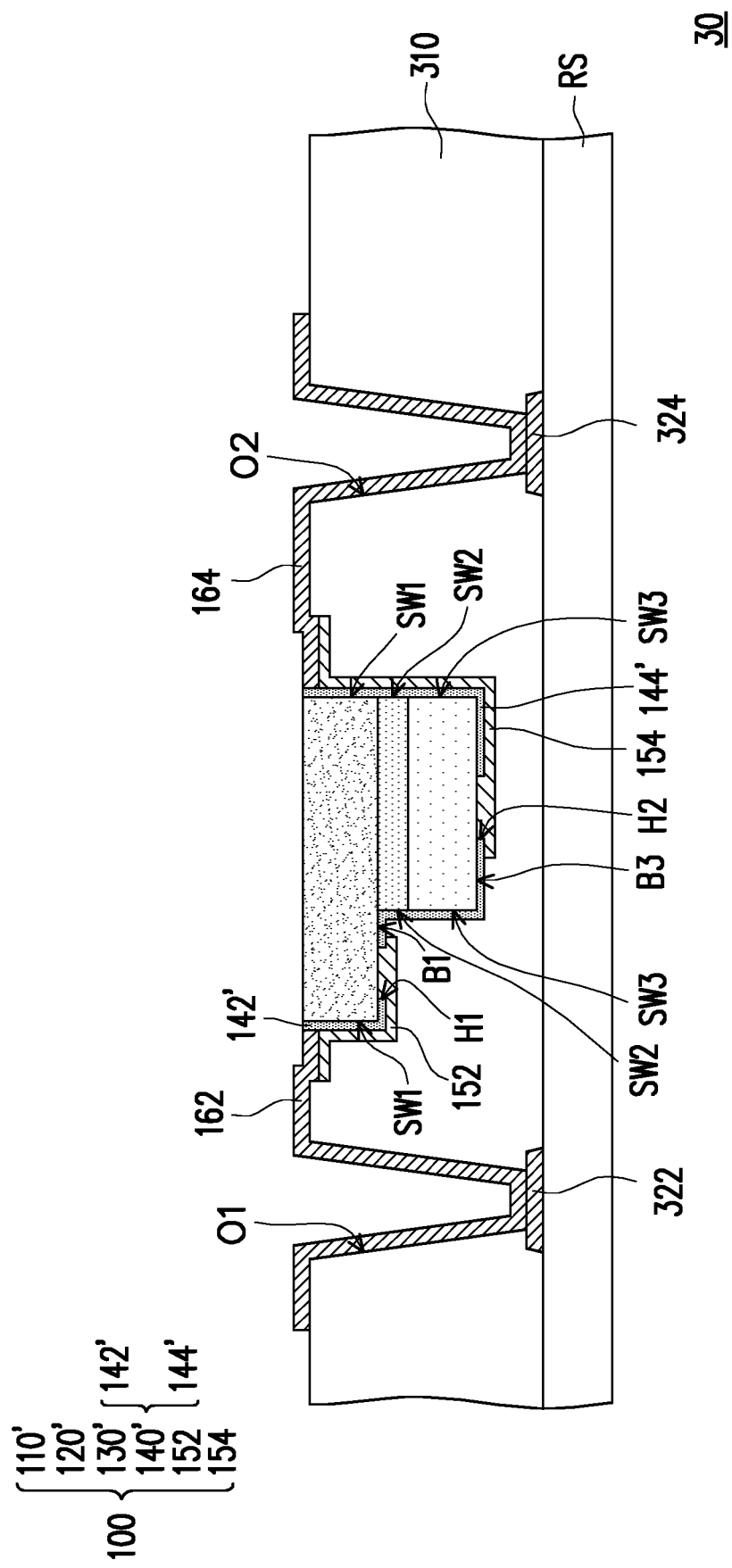
FIG. 19 is a cross-sectional view schematic showing a light emitting device according to a third embodiment of the disclosure.

FIG. 19 is a cross-sectional view showing a light emitting device in accordance with a third embodiment of the disclosure. What must be stated here is, the third embodiment follows the component number and part of the second embodiment, where the same or similar reference numerals are used to denote the same or similar devices, and the description of the same technical content is omitted. For the description of the omitted part, reference may be made to the foregoing embodiment, details won't be reiterated.

Referring to FIG. 19, in the light emitting device 30 of the third embodiment, the substrate RS includes a first pad 322 and a second pad 324. In the third embodiment, a first opening O1 and a second opening O2 are formed in the adhesive layer 310, the first opening O1 and the second opening O2 correspond to the first pad 322 and the second pad 324, respectively. The first opening O1 and the second opening O2 are formed, for example, after the μLED 100 is transferred onto the adhesive layer 310, however, the disclosure is not limited thereto. In other embodiments, the first opening O1 and the second opening O2 are formed, for example, before the μLED 100 is transferred to the adhesive layer 310.

The first conductive layer 162 is electrically connected to the first pad 322 of the substrate RS through the first opening O1 of the adhesive layer 310, the second conductive layer 164 is electrically connected to the second pad 324 of the substrate RS through the second opening O2 of the adhesive layer 310. The first pad 322 and the second pad 324 are electrically connected, for example, to a driving circuit (not shown, and can be see above-mentioned description) that controls the μLED 100.

Figure 20:
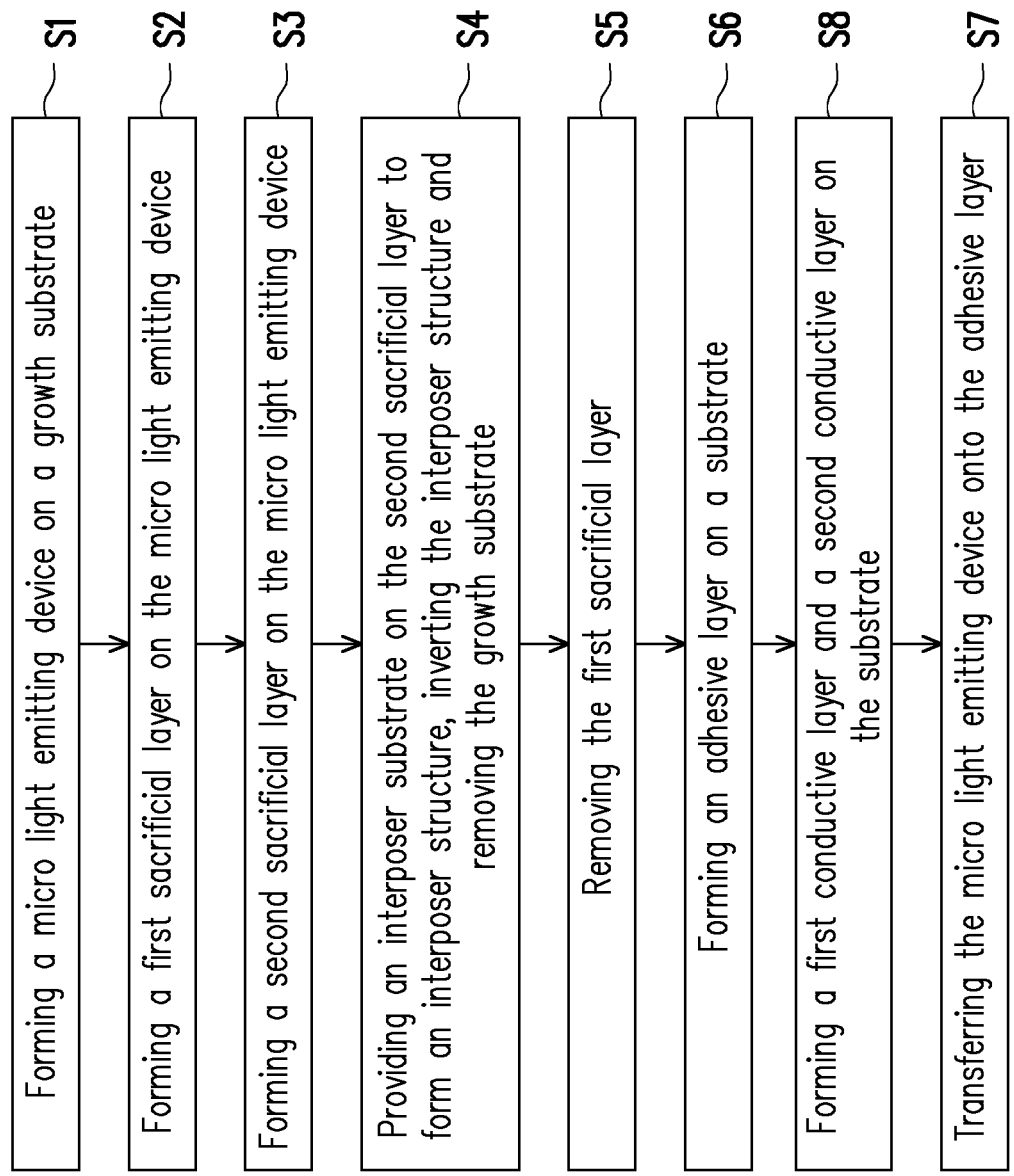
FIG. 20 is a flow chart of a method of manufacturing a light emitting device according to an embodiment of the disclosure.

FIG. 20 is a flow chart of a method of manufacturing a light emitting device in accordance with an embodiment of the disclosure. What must be stated here is, this embodiment follows the component number and part of the embodiment of FIG. 1, where the same or similar reference numerals are used to denote the same or similar devices, and the description of the same technical content is omitted. For the description of the omitted part, reference may be made to the foregoing embodiment, details won't be reiterated.

The main difference between the embodiment of FIG. 20 and the embodiment of FIG. 1 is that in the embodiment of FIG. 20, the μLED is transferred onto the adhesive layer after forming the first conductive layer and the second conductive layer on the substrate.

Figure 21:
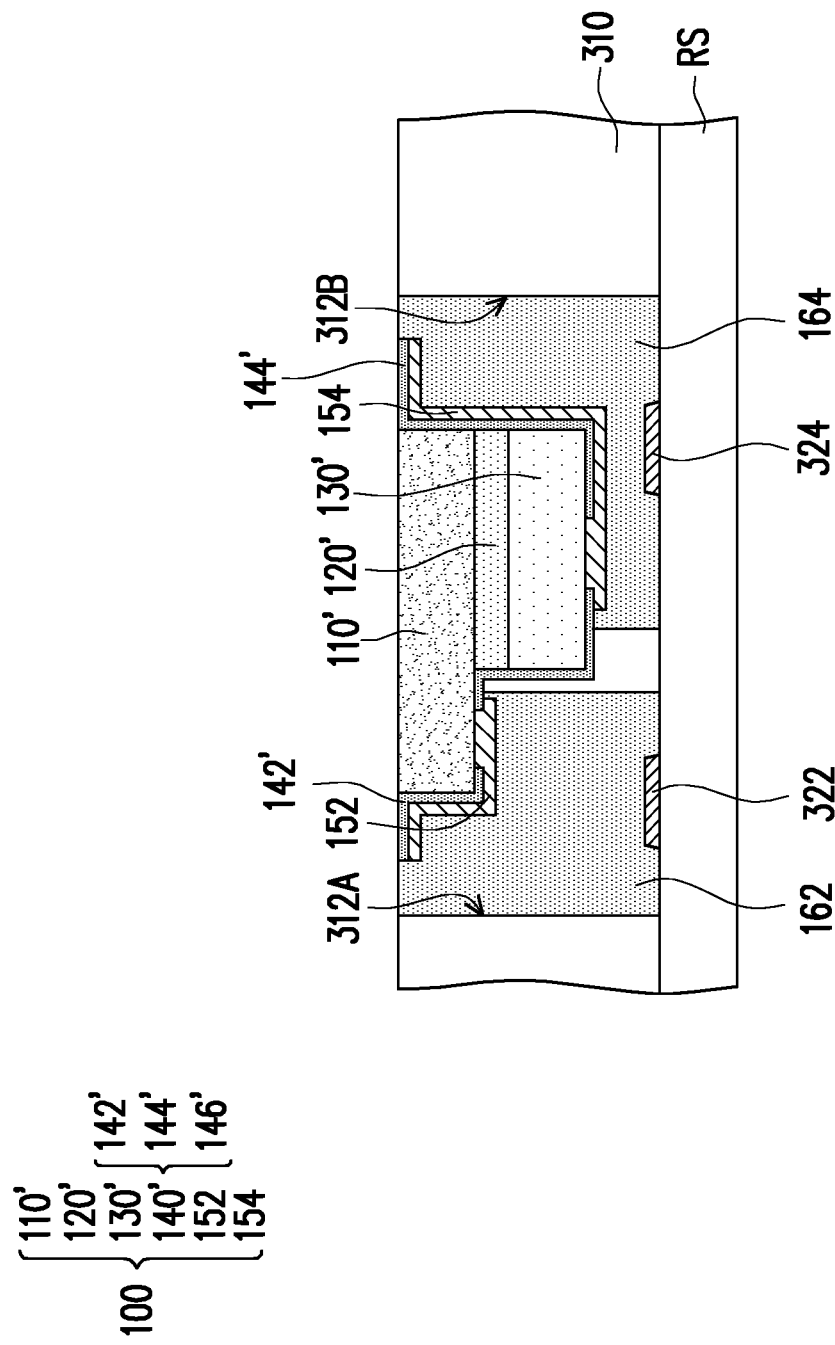
FIG. 21 is a cross-sectional view schematic showing a light emitting device according to a fourth embodiment of the disclosure.

The light emitting device of the embodiment of FIG. 20 is shown in FIG. 21. FIG. 21 is a cross-sectional view showing a light emitting device in accordance with a fourth embodiment of the disclosure. What must be stated here is, the fourth embodiment follows the component number and part of the first embodiment, where the same or similar reference numerals are used to denote the same or similar devices, and the description of the same technical content is omitted. For the description of the omitted part, reference may be made to the foregoing embodiment, details won't be reiterated.

Referring to FIG. 21, in a light emitting device 40 of the fourth embodiment, a first sub-groove 312A and a second sub-groove 312B are formed in the adhesive layer 310. A first conductive layer 162 and a second conductive layer 164 are formed respectively in the first sub-groove 312A and the second sub-groove 312B, wherein the first conductive layer 162 is in contact with the first pad 322 of the substrate RS, and the second conductive layer 164 is in contact with the second pad 324 of the substrate RS.

After forming the first conductive layer 162 and the second conductive layer 164, the micro light emitting device 100 is transferred onto the adhesive layer 310. The first electrode 152 is electrically connected to the first conductive layer 162, the second electrode 154 is electrically connected to the second conductive layer 164.

At least one of the first conductive layer 162 and the second conductive layer 164 may be a single layer or a multilayer structure, and the material of the at least one of the first conductive layer 162 and the second conductive layer 164 includes conductive adhesive (or namely conductive glue), for example: anisotropic conductive adhesive, isotropic conductive adhesive, silver paste, or other suitable material. In the embodiment, the materials of the first conductive layer 162 and the second conductive layer 164 are conductive adhesive. In other words, the conductive adhesive in the first sub-groove 312A and the second sub-groove 312B may be regarded as having a conductive effect, preferably, also has a substantially sticky effect. If the conductive paste is also considered as another part of the adhesive layer 310, then, one part of the adhesive layer 310 is conductive and adhesive.

In this embodiment, the tether layer 140' may also include a first extension 142', a second extension 144', and a tether 146' (not shown in figure), however, the disclosure is not limited thereto.

In the foregoing embodiment, the size of the μLED is less than 100 microns and greater than 0 microns. Preferably, the size of the μLED is less than 50 microns and greater than 0 microns. In the foregoing embodiment, the μLEDs may be considered as flip-chip μLEDs. In the foregoing embodiment, the type of transistor can be a bottom gate type, a top gate type, a stereo type, or other suitable types of transistor, and the number of transistors can be designed as needed.

In summary, in the light emitting device of the disclosure, the first electrode, the second electrode, the first conductive layer and the second conductive layer do not block the light emitting surface of the μLED, thereby increasing the effective light emitting area of the μLED.

Although the disclosure has been disclosed by way of example, however, it will be apparent to those skilled in the art that various modifications and variations can be made to the disclosed embodiments without departing from the scope or spirit of the disclosure, therefore, the scope of protection of the disclosure is subject to the definition of the scope of the appended patent application.

What is claimed is:

1. A light emitting device, comprising:
a substrate;
an adhesive layer, located on the substrate, wherein a lower surface of the adhesive layer faces the substrate and an upper surface of the adhesive layer faces away the substrate;
a micro light emitting device, located in a recess of the adhesive layer, wherein a light emitting surface of the micro light emitting device is away from the substrate, and the micro light emitting device comprises:
a first semiconductor layer;
a second semiconductor layer, overlapping the first semiconductor layer, wherein a vertical projection area of the first semiconductor layer on the substrate is larger than a vertical projection area of the second semiconductor layer on the substrate, and the second semiconductor layer is closer to the substrate than the first semiconductor layer;
a tether layer, covering a portion of the side surface of the first semiconductor layer, a portion of the lower surface of the first semiconductor layer, the side surface of the second semiconductor layer, and a portion of the lower surface of the second semiconductor layer, wherein the tether layer has a first through hole and a second through hole, the first through hole corresponds to the portion of the lower surface of the first semiconductor layer, and the second through hole corresponds to the portion of the lower surface of the second semiconductor layer;
a first electrode, located on the tether layer, and electrically connected to the first semiconductor layer through the first through hole; and
a second electrode, located on the tether layer, and electrically connected to the second semiconductor layer through the second through hole;
a first conductive layer, located on the substrate, and electrically connected to the first electrode; and
a second conductive layer, located on the substrate, and electrically connected to the second electrode, wherein a portion of the tether layer is located between the second conductive layer and the side surface of the first semiconductor layer, and a vertical projection area of the portion of the tether layer on the side surface of the first semiconductor layer is adjacent to a vertical projection area of the second conductive layer on the side surface of the first semiconductor layer,
wherein a portion of the first electrode extends from the tether layer along a first direction away from the first semiconductor layer, and a portion of the second electrode extends from the tether layer along a second direction away from the first semiconductor layer, and
an endpoint of the portion of the tether layer is located between a surface of the second electrode facing to the side surface of the first semiconductor layer and the side surface of the first semiconductor layer, and a vertical projection area of the endpoint of the portion of the tether layer on the substrate is not larger than a vertical projection area of the portion of the first electrode on the substrate and a vertical projection area of the portion of the second electrode on the substrate, wherein the first direction and the second direction are parallel to the substrate.

2. The light emitting device according to claim 1, wherein the substrate has a first pad and a second pad, wherein the first conductive layer is electrically connected to the first pad through a first opening of the adhesive layer, and the second conductive layer is electrically connected to the second pad through a second opening of the adhesive layer.

3. The light emitting device according to claim 1, wherein a first overlapping portion of the first electrode overlaps and contacts the first conductive layer, a second overlapping portion of the second electrodes overlaps and contacts the second conductive layer.

4. The light emitting device according to claim 1, wherein the first conductive layer and the second conductive layer are located on the adhesive layer.

5. The light emitting device according to claim 1, wherein the recess of the adhesive layer has a first sub-groove and a second sub-groove, wherein the first conductive layer is disposed in the first sub-groove and is in contact with a first pad of the substrate, the second conductive layer is disposed in the second sub-groove and is in contact with a second pad of the substrate.

6. The light emitting device according to claim 5, wherein the material of at least one of the first conductive layer and the second conductive layer comprises a conductive adhesive.

7. The light emitting device as claimed in claim 1, wherein the upper surface of the adhesive layer has a first sub-groove exposing a portion of the first electrode, and the upper surface of the adhesive layer has a second sub-groove exposing a portion of the second electrode.

8. A light emitting device, comprising:
a substrate;
an adhesive layer, located on the substrate, wherein a lower surface of the adhesive layer faces the substrate and an upper surface of the adhesive layer faces away the substrate;
a micro light emitting device, located in a recess of the adhesive layer, wherein a light emitting surface of the micro light emitting device is away from the substrate, and the micro light emitting device comprises:
a first semiconductor layer;
a second semiconductor layer, overlapping the first semiconductor layer, wherein a vertical projection area of the first semiconductor layer on the substrate is larger than a vertical projection area of the second semiconductor layer on the substrate, and the second semiconductor layer is closer to the substrate than the first semiconductor layer;
a tether layer, covering a portion of the side surface of the first semiconductor layer, a portion of the lower surface of the first semiconductor layer, the side surface of the second semiconductor layer, and a portion of the lower surface of the second semiconductor layer, wherein the tether layer has a first through hole and a second through hole, the first through hole corresponds to the portion of the lower surface of the first semiconductor layer, and the second through hole corresponds to the portion of the lower surface of the second semiconductor layer;
a first electrode, located on the tether layer, and electrically connected to the first semiconductor layer through the first through hole; and
a second electrode, located on the tether layer, and electrically connected to the second semiconductor layer through the second through hole;
a first conductive layer, located on the substrate, and electrically connected to the first electrode; and
a second conductive layer, located on the substrate, and electrically connected to the second electrode, wherein a portion of the tether layer is located between the second conductive layer and the side surface of the first semiconductor layer, and a vertical projection area of the portion of the tether layer on the side surface of the first semiconductor layer is adjacent to a vertical projection area of the second conductive layer on the side surface of the first semiconductor layer
wherein a portion of the first electrode extends from the tether layer along a first direction away from the first semiconductor layer, and a portion of the second electrode extends from the tether layer along a second direction away from the first semiconductor layer, and
the portion of the first electrode extending from the tether layer along the first direction away from the first semiconductor layer and the portion of the second electrode extending from the tether layer along the second direction away from the first semiconductor layer are not overlapped with an endpoint of the portion of the tether layer in a normal direction of the substrate, wherein the first direction and the second direction are parallel to the substrate.

9. A light emitting device, comprising:
a substrate;
an adhesive layer, located on the substrate, wherein a lower surface of the adhesive layer faces the substrate and an upper surface of the adhesive layer faces away the substrate;
a micro light emitting device, located in a recess of the adhesive layer, wherein a light emitting surface of the micro light emitting device is away from the substrate, and the micro light emitting device comprises:
a first semiconductor layer;
a second semiconductor layer, overlapping the first semiconductor layer, wherein a vertical projection area of the first semiconductor layer on the substrate is larger than a vertical projection area of the second semiconductor layer on the substrate, and the second semiconductor layer is closer to the substrate than the first semiconductor layer;
a tether layer, covering a portion of the side surface of the first semiconductor layer, a portion of the lower surface of the first semiconductor layer, the side surface of the second semiconductor layer, and a portion of the lower surface of the second semiconductor layer, wherein the tether layer has a first through hole and a second through hole, the first through hole corresponds to the portion of the lower surface of the first semiconductor layer, and the second through hole corresponds to the portion of the lower surface of the second semiconductor layer;
a first electrode, located on the tether layer, and electrically connected to the first semiconductor layer through the first through hole; and
a second electrode, located on the tether layer, and electrically connected to the second semiconductor layer through the second through hole;
a first conductive layer, located on the substrate, and electrically connected to the first electrode; and
a second conductive layer, located on the substrate, and electrically connected to the second electrode, wherein a portion of the tether layer is located between the second conductive layer and the side surface of the first semiconductor layer, and a vertical projection area of the portion of the tether layer on the side surface of the first semiconductor layer is adjacent to a vertical projection area of the second conductive layer on the side surface of the first semiconductor layer, wherein the upper surface of the adhesive layer has a first sub-groove exposing a portion of the first electrode, and the upper surface of the adhesive layer has a second sub-groove exposing a portion of the second electrode, and an endpoint of the tether layer is located below a top surface of the first semiconductor layer, a space that is defined between the endpoint of the tether layer, the side surface of the first semiconductor layer, the portion of the second electrode and the adhesive layer accommodates a part of the second conductive layer.

10. A light emitting device, comprising:

a substrate;

an adhesive layer, located on the substrate, wherein a lower surface of the adhesive layer faces the substrate and an upper surface of the adhesive layer faces away the substrate;

a micro light emitting device, located in a recess of the adhesive layer, wherein a light emitting surface of the micro light emitting device is away from the substrate, and the micro light emitting device comprises:

a first semiconductor layer;

a second semiconductor layer, overlapping the first semiconductor layer, wherein a vertical projection area of the first semiconductor layer on the substrate is larger than a vertical projection area of the second semiconductor layer on the substrate, and the second semiconductor layer is closer to the substrate than the first semiconductor layer;

a tether layer, covering a portion of the side surface of the first semiconductor layer, a portion of the lower surface of the first semiconductor layer, the side surface of the second semiconductor layer, and a portion of the lower surface of the second semiconductor layer, wherein the tether layer has a first through hole and a second through hole, the first through hole corresponds to the portion of the lower surface of the first semiconductor layer, and the second through hole corresponds to the portion of the lower surface of the second semiconductor layer;

a first electrode, located on the tether layer, and electrically connected to the first semiconductor layer through the first through hole; and a second electrode, located on the tether layer, and electrically connected to the second semiconductor layer through the second through hole;

a first conductive layer, located on the substrate, and electrically connected to the first electrode; and a second conductive layer, located on the substrate, and electrically connected to the second electrode, wherein a portion of the tether layer is located between the second conductive layer and the side surface of the first semiconductor layer, and a vertical projection area of the portion of the tether layer on the side surface of the first semiconductor layer is adjacent to a vertical projection area of the second conductive layer on the side surface of the first semiconductor layer, wherein the upper surface of the adhesive layer has a first sub-groove exposing a portion of the first electrode, and the upper surface of the adhesive layer has a second sub-groove exposing a portion of the second electrode, and a space is defined between the tether layer located on the side surface of the first semiconductor layer, the portion of the second electrode and the adhesive layer, and the space accommodates a part of the second conductive layer.

\* \* \* \* \*